(12) United States Patent
Tsunekane

(10) Patent No.: US 7,130,323 B2
(45) Date of Patent: Oct. 31, 2006

(54) SEMICONDUCTOR LASER DEVICE AND SEMICONDUCTOR-LASER EXCITED SOLID-STATE LASER APPARATUS

(75) Inventor: Masaki Tsunekane, Tokyo (JP)

(73) Assignee: NEC Corporation, Tokyo (JP)

( * ) Notice: Subject to any disclaimer, the term of this patent is extended or adjusted under 35 U.S.C. 154(b) by 270 days.

(21) Appl. No.: 10/779,645

(22) Filed: Feb. 18, 2004

(65) Prior Publication Data

US 2004/0161011 A1 Aug. 19, 2004

(30) Foreign Application Priority Data

Feb. 19, 2003 (JP) .............................. 2003-040932

(51) Int. Cl.
*H01S 3/00* (2006.01)
(52) U.S. Cl. ................................ 372/38.09; 372/38.02
(58) Field of Classification Search .................. 372/35, 372/36, 34
See application file for complete search history.

(56) References Cited

U.S. PATENT DOCUMENTS

| | | | |
|---|---|---|---|
| 5,764,675 A | 6/1998 | Juhala | |
| 6,018,602 A | 1/2000 | Mayor et al. | |
| 6,768,753 B1 * | 7/2004 | Treusch | 372/38.09 |
| 6,862,304 B1 * | 3/2005 | Maurer et al. | 372/36 |

FOREIGN PATENT DOCUMENTS

| | | |
|---|---|---|
| EP | 1 182 757 A2 | 2/2002 |
| JP | 59103565 * | 6/1984 |
| JP | H59-103565 A | 6/1984 |
| JP | 60-88499 U | 6/1985 |
| JP | H62-299092 A | 12/1987 |
| JP | 10-284798 A | 10/1998 |
| JP | P2002-25784 A | 1/2002 |
| WO | WO 03/075423 A1 | 9/2003 |

* cited by examiner

*Primary Examiner*—Misun Oh Harvey
*Assistant Examiner*—Tuan N. Nguyen
(74) *Attorney, Agent, or Firm*—Sughrue Mion, PLLC

(57) ABSTRACT

A semiconductor laser device in a semiconductor-laser excited solid-state laser apparatus is provided with a plurality of semiconductor laser diodes connected in series to one another. Each of a plurality of bypass diodes is connected in parallel to each semiconductor laser diode or each group of at least two semiconductor laser diodes in the plurality of semiconductor laser diodes and has a higher rising voltage than a rising voltage of the parallel-connected semiconductor laser diodes. The polarity of one end of each of the semiconductors laser diode is the same as the polarity of that end of the associated bypass diode which is connected to the one end of that semiconductor laser diode and the polarity of the other end of the semiconductor laser diode is the same as the polarity of that end of the associated bypass diode which is connected to the other end of that semiconductor laser diode. This structure accomplish continuous light emission with a simple and compactable circuit structure even if one or more semiconductor laser diodes are disconnected, thereby making the semiconductor laser device highly reliable.

16 Claims, 17 Drawing Sheets

SEMICONDUCTOR LASER DEVICE AND SEMICONDUCTOR-LASER EXCITED SOLID-STATE LASER APPARATUS

BACKGROUND OF THE INVENTION

1. Field of the Invention

The present invention relates to a semiconductor laser device having a plurality of semiconductor laser diodes connected in series, and a semiconductor-laser excited solid-state laser apparatus having this semiconductor laser device.

2. Description of the Related Art

In production controls (e.g., stock control, process control, quality control, etc.) which are carried out in a company or so, so-called marking or a work of marking characters, a figure, a symbol or so on products, parts, packages and so forth is often performed.

The marking is carried out by various ways, such as printing, ink jet, stamping, sealing, engraving, punching, edging, ultrasonic wave and laser. Of those schemes, laser marking using a laser beam has been receiving attention recently due to its multiple features, such as non-contact, fineness and delicateness, non-vanishing marking, dry process, fast process, easy automation, easy power saving and flexibility.

Laser marking is executed by using a laser marker which uses a $CO_2$ laser or gas laser, a YAG laser or a solid-state laser, or the like.

According to the exciting system, there are different types of YAG lasers that include a lamp-excited YAG laser which uses a discharge tube and a semiconductor-excited YAG laser which uses a semiconductor.

Because the semiconductor excitation has a higher energy conversion efficiency from electric energy to optical energy by about 30% to 40% and a very short emission spectrum width of about 3 mm, as compared with the lamp excitation, it provides an extremely high efficiency when matched with the absorption spectrum of the YAG crystal. Further, the semiconductor excitation has an excellent directivity to achieve easier light condensing.

While the YAG laser, like a ruby laser and glass laser, belongs to a solid-state laser, a solid-state laser which has a semiconductor as an excitation light source (LD-excited solid-state laser), particularly, has features such as high out power, high efficiency, high beam quality, small size, high stability and long life.

Accordingly, the LD-excited solid-state laser is recently used in every field, such as laser processing on electronics (trimming and fine processing, thin film generation, etc. by a marking apparatus), physical and chemical research (spectral analysis), welding of vehicle bodies, medical care, aeronautics, biotechnology, life science and engineering.

Particularly, an LD-excited solid-state laser apparatus which emits laser power of kilowatts using over hundred LDs in a single apparatus has been developed.

There are mainly a rod type, fiber type and thin disk type LD-excited solid-state lasers.

In the rod type, as shown in FIG. 1, with excited lights from a laser array 110, a laser rod 120 excites a laser beam which reciprocates between a rear mirror 130 and an output mirror 140 and is output from the output mirror 140.

The laser array 110 has a plurality of semiconductor laser diodes to irradiate several ten to several hundred lights onto the laser rod 120.

This semiconductor laser diode is said to have a longer life more than ten times the life of a lamp and be continuously usable for 10,000 hours or so.

As this is an average time, however, some of the semiconductor laser diodes may suffer power reduction in several thousand hours or so and it is difficult to completely identify and remove them in the initial selection of semiconductor laser diodes.

The semiconductor laser diode that is degraded and fails to output light becomes a heat source which generates heat twice as great as the heat generated by a normal semiconductor laser diode. Such a semiconductor laser diode damages itself or parts surround it and eventually results in disconnection.

A semiconductor laser diode may have its life shorted considerably by disturbance, such as an electric surge from static electricity or a power source, return light, dust or gas, or dewing, or an external environment not only due to a variation in its components or its productional variation but also depending on the state where the semiconductor laser diode is mounted on a semiconductor laser device, and may be damaged or disconnected by abnormal heat generated.

What is more, plural semiconductor laser diodes in a semiconductor laser device are connected in series to one another, so that when a single semiconductor laser diode is disconnected due to failure, for example, the current does not flow to the other semiconductor laser diodes.

That is, failure or disconnection of only a single semiconductor laser diode in several ten to several hundred semiconductor laser diodes disables the other multiple semiconductor laser diodes to output lights. This inhibits emission of a laser beam from an LD-excited solid-state laser apparatus 100.

In this respect, various schemes have been proposed by which even if at least one semiconductor laser diode in a plurality of semiconductor laser diodes fails or is disconnected, other normal semiconductor laser diodes can be enabled to emit lights continuously.

For instance, there is a circuit which has a plurality of series-connected light emitting elements to each of which one Zener diode or at least two Zener diodes are connected (as disclosed in, for example, Japanese Utility Model Laid-Open No. 088499/1985 which is referred hereafter as first prior art).

There is another example that has a monitor circuit which monitors the optical outputs of a plurality of semiconductor laser diodes, a comparison circuit which determines a drop in each optical output bypass diode a detection signal from the monitor circuit and a bypass control circuit which causes the current to flow to a bypass circuit, not the semiconductor laser diodes, when the optical output has dropped (as disclosed in, for example, Japanese Patent Laid-Open No. 284789/1998 which is referred hereinafter as second prior art).

As the first prior art uses the reverse voltage characteristic (breakdown characteristic) of a Zener diode as a bypass device, however, it has a problem on control of the Zener diode.

In general, a laser processing apparatus using a Zener diode is demanded of a quicker rising time for the laser output to become a rated level and is used in many ways to modulate the laser output in an arbitrary waveform. The laser processing apparatus therefore employs feedback control of the current from a laser diode while monitoring the laser beam.

In such a feedback system, it is very important to set the response time constant of a circuit which includes a laser diode. A diode and a Zener diode significantly differ from each other in current-voltage characteristic. In case where some diode in the circuit is disconnected and the current starts flowing to a Zener diode connected in parallel to the diode, therefore, the time constant of the circuit that is set with diodes alone greatly varies, which may lead to a significant delay of the rising time, a dull waveform or overshooting.

Individual phenomena originated from such a change in time constant delay the recovery time after disconnection and a variation in the output intensity of the laser beam in a semiconductor laser device which enables continuous light emission even if some diode is disconnected, and should therefore be overcome.

As the fist prior art uses an electric bulb or fluorescence lamp as a light emitting element, the breakdown characteristic obtained when the reverse voltage is applied to a Zener diode can be used. In case where a semiconductor laser diode is used as a light emitting element, however, the breakdown characteristic of the Zener diode cannot used sufficiently.

When a light emitting element is an electric bulb or fluorescence lamp, for example, the voltage and the current to cause the light emitting element to emit light are normally several tens of volts to a hundred and several tens of volts and several hundred milliamperes to several amperes, respectively.

By way of contrast, a Zener diode is normally driven when applied with a voltage of over 5 volts and the general rated current ranges from several hundred milliamperes to several amperes.

In case where an electric bulb or fluorescence lamp is used as a light emitting element, therefore, the use of a Zener diode as a bypass device is the usage within the range of the rated values so that it is possible to make good use of the breakdown characteristic.

In case where the light emitting element is a semiconductor laser diode, however, the voltage and the current to cause the semiconductor laser diode to emit light are normally 1 to 3 volts and around hundred amperes, respectively.

Within the range of a low voltage (approximately 5 volts or lower), it is normally difficult that the Zener diode provides a stable voltage in a low current range.

In case where a laser diode is used as a light emitting element, therefore, the use of a Zener diode as a bypass device raises a problem that a stable breakdown characteristic cannot be acquired due to a low voltage being applied to the Zener diode.

Because the second prior art has the monitor circuit, comparison circuit, etc. in addition to the bypass circuit, it has a problem that space for the individual circuits should be secured.

Recently, attempts have been made to make a semiconductor laser device and an LD-excited solid-state laser apparatus compact to enhance the functionality and portability. This requires that a circuit which enables continuous light emission even if at least one semiconductor laser diode fails or is disconnected should also have a simple and compact circuit structure.

SUMMARY OF THE INVENTION

Accordingly, it is an object of the present invention to provide a semiconductor laser device and a semiconductor-laser excited solid-state laser apparatus which can suppress the delay of the rising time, a dull waveform or so when some semiconductor laser diode is disconnected, can avoid the use of the breakdown characteristic of a Zener diode that is not effective under low-voltage application, and can accomplish continuous light emission even when at least one semiconductor laser diode fails or is disconnected with a simple circuit structure that can be made compact.

A semiconductor laser device according to the present invention comprises:

a plurality of semiconductor laser diodes connected in series to one another;

a plurality of bypass diodes each connected in parallel to each semiconductor laser diode or each group of semiconductor laser diodes in all or a part of the semiconductor laser diodes and having a higher rising voltage than a rising voltage of the parallel-connected semiconductor laser diodes, that parallel connection being made in such a way that a polarity of one end of each of the semiconductors laser diode is the same as a polarity of that end of the associated bypass diode which is connected to the one end of that semiconductor laser diode and a polarity of the other end of the semiconductor laser diode is the same as a polarity of that end of the associated bypass diode which is connected to the other end of that semiconductor laser diode.

With the thus constructed semiconductor laser device, bypass diodes are connected in parallel to series-connected semiconductor laser diodes, so that if at least one semiconductor laser diode fails or is disconnected, the current flows to the bypass diode that is connected in parallel to this failing or disconnected semiconductor laser diode. This makes it possible to keep letting the current to flow to the other semiconductor laser diodes which are not failing or disconnected.

It is therefore possible to accomplish continuous light emission from a semiconductor laser device or a semiconductor-laser excited solid-state laser apparatus when at least one semiconductor laser diode fails or is disconnected.

Further, as the bypass diode does not use the breakdown characteristic of a Zener diode but uses the current-voltage characteristic when a forward voltage is applied to an ordinary diode, it is possible to make considerably small a variation in the time constant of the circuit in case where some of plural semiconductor laser diodes in the semiconductor laser device are disconnected and the current starts flowing to the bypass diodes connected in parallel to the disconnected semiconductor laser diodes.

Even if some semiconductor laser diodes are disconnected, therefore, the delay of the rising time, a dull waveform, etc. can be restrained and the recovery time after disconnection and a variation in the output intensity of the laser beam can eventually be improved.

What is more, as a diode to be used as a bypass device is an ordinary diode, not a Zener diode, and a forward voltage, not a reverse voltage, is applied to the ordinary diode, the present invention employs the forward voltage characteristic of an ordinary diode which is effective even under low-voltage application.

It is therefore possible to accomplish continuous light emission from a semiconductor laser device or a semiconductor-laser excited solid-state laser apparatus when at least one semiconductor laser diode fails or is disconnected by using the rising voltage characteristic of the forward voltage of an ordinary diode which is effective even under low-voltage application and without using the breakdown characteristic of a Zener diode which is not effective under low-voltage application (it is difficult to obtain a stable characteristic under low-voltage application).

Particularly, a bypass diode has a higher rising voltage than the rising voltage of a semiconductor laser diode.

In the normal mode, therefore, the current hardly flows to the bypass diode while the necessary current flows only to the semiconductor laser diode to ensure emission of excited light, and if a failure or disconnection occurs in the semiconductor laser diode, the current flows to the bypass diode to permit the current supply to the other semiconductor laser diodes which are not failing or disconnected.

This makes it possible to accomplish continuous light emission from a semiconductor laser device or a semiconductor-laser excited solid-state laser apparatus when at least one semiconductor laser diode fails or is disconnected.

In addition, because a diode is the only device to be used as a bypass device, it is possible to accomplish continuous light emission from a semiconductor laser device or a semiconductor-laser excited solid-state laser apparatus when at least one semiconductor laser diode fails or is disconnected.

The semiconductor laser device may further comprise heat sinks respectively fixed to the semiconductor laser diodes and each having a refrigerant inside.

With this structure of the semiconductor laser device, heat generated from the semiconductor laser diode can be absorbed by the heat sink. This makes it possible to repress the loss of the device originated from the generated heat.

This semiconductor laser device may further comprise a manifold which supplies the refrigerant to each of the heat sinks.

With this structure of the semiconductor laser device, the heat sink can receive the refrigerant from the manifold, so that the refrigerant can absorb the heat generated from the semiconductor laser diode. This makes it possible to prevent the individual elements from being damaged by the generated heat.

Any one of the above-described semiconductor laser devices may further comprise a first cooling member which is connected to the bypass diodes to cool the bypass diodes.

With this structure of the semiconductor laser device, the first cooling member can absorb the heat generated from the bypass diode, thus making it possible to prevent the individual elements from being damaged by the generated heat.

In this semiconductor laser device, the first cooling member may comprise a cold plate having a refrigerant inside.

With the structure of the semiconductor laser device, the cold plate as the first cooling member can absorb the heat generated from the bypass diode by means of the refrigerant. It is therefore possible to prevent the individual elements from being damaged by the heat generated from the bypass diode.

In the semiconductor laser device, each of the bypass diode may be fixed to that of the heat sinks which is fixed to the associated semiconductor laser diode connected in parallel to that bypass diode.

With this structure of the semiconductor laser device, the heat sink can absorb the heat generated from the bypass diode as well as the heat generated from the semiconductor laser diode. This can hinder a reduction in the performance of the individual diodes or so originated from the heat generated from the diodes.

Further, the heat sink can absorb both the heat generated from the semiconductor laser diode and the heat generated from the bypass diode, it is unnecessary to provide an exclusive heat absorbing member for the bypass diode. This can contribute to reducing the required space for components and cost reduction.

The semiconductor laser device may be constructed in such a way that each of the bypass diode is fixed to the associated heat sink in such a way that a p side of the bypass diode contacts the heat sink, an n-type electrode is provided on an n side of the bypass diode, and the n-type electrode is connected to a p-type electrode of another bypass diode.

With this structure of the semiconductor laser device, the heat sink, the bypass diode and the n-type electrode are connected in direct contact with one another, thus making wirings among them unnecessary.

Further, as the bypass diode and the n-type electrode are formed one on the other at one place on the same side of the heat sink, the top surface area of the heat sink can be made smaller as compared with the case where the bypass diode and the n-type electrode are provided separately on the heat sink. This also can ensure miniaturization of a semiconductor laser device.

The semiconductor laser device may be constructed in such a way that an n-type electrode is provided at each of the heat sinks via a first insulating member, each of the heat sinks has a p-type electrode member in such a way that the p-type electrode member penetrates the first insulating member and the n-type electrode, and a second insulating member is provided between the p-type electrode member and the n-type electrode.

With this structure of the semiconductor laser device, the top surface area of the heat sink can be made smaller as compared with the case where the p-type electrode member and the n-type electrode are provided separately on the heat sink. This can ensure miniaturization of a semiconductor laser device.

This semiconductor laser device may be constructed in such a way that the bypass diode is provided in place of the first insulating member an, the p-type electrode member is provided in such a way as to penetrate the bypass diode and the n-type electrode, and the second insulating member is provided between the p-type electrode member and the n-type electrode and between the p-type electrode member and the bypass diode.

With this structure of the semiconductor laser device, the semiconductor laser device can be made more compact as compared with the case where the p-type electrode member, the n-type electrode and the bypass diode are provided separately.

In the semiconductor laser device, an extension member may be provided at the n-type electrode in such a way that a top of the extension portion is positioned at a same height as a height from the heat sink to a top of the p-type electrode member.

The structure of the semiconductor laser device facilitates wirings to the p-type electrode member and the n-type electrode.

In the semiconductor laser device, the bypass diodes may be fixed to the manifold.

With this structure of the semiconductor laser device, as the manifold which has a refrigerant inside can absorb heat generated from the bypass diode. Accordingly, a rise in the temperature inside the semiconductor laser device originated from the heat generated from the bypass diode can be suppressed, thereby preventing the individual elements from being damaged.

A semiconductor-laser excited solid-state laser apparatus according to the invention has any of the semiconductor laser devices of the invention described above.

With the structure of the semiconductor-laser excited solid-state laser apparatus, bypass diodes are connected in parallel to semiconductor laser diodes of the semiconductor laser device, so that if at least one semiconductor laser diode is disconnected or fails, the current flows to the bypass diode that is connected in parallel to this disconnected or failing semiconductor laser diode so. This makes it possible to keep letting the current to flow to the other semiconductor laser diodes which are not disconnected or failing.

It is therefore possible to accomplish continuous light emission from a semiconductor-laser excited solid-state laser apparatus when at least one semiconductor laser diode.

Further, as the bypass diode does not use the breakdown characteristic of a Zener diode but uses the current-voltage characteristic when a forward voltage is applied to an ordinary diode, the delay of the rising time, a dull waveform, etc. at the time some semiconductor laser diodes are disconnected can be suppressed and the use of the breakdown characteristic of a Zener diode which is not effective under low-voltage application can be avoid.

In addition, because a diode is the only device to be used as a bypass device to be connected in parallel to the series-connected semiconductor laser diodes, it is possible to accomplish continuous light emission from a semiconductor laser device or a semiconductor-laser excited solid-state laser apparatus when at least one semiconductor laser diode fails or is disconnected with a simple circuit structure that can be made compact.

DETAILED DESCRIPTION OF THE PREFERRED EMBODIMENTS

Preferred embodiments of a semiconductor laser device and a semiconductor-laser excited solid-state laser apparatus according to the invention are described below with reference to the accompanying drawings.

(First Embodiment)

To begin with, the general structure of a semiconductor laser device according to the first embodiment of the invention is discussed below referring to FIGS. 2 and 3.

Figure 1:
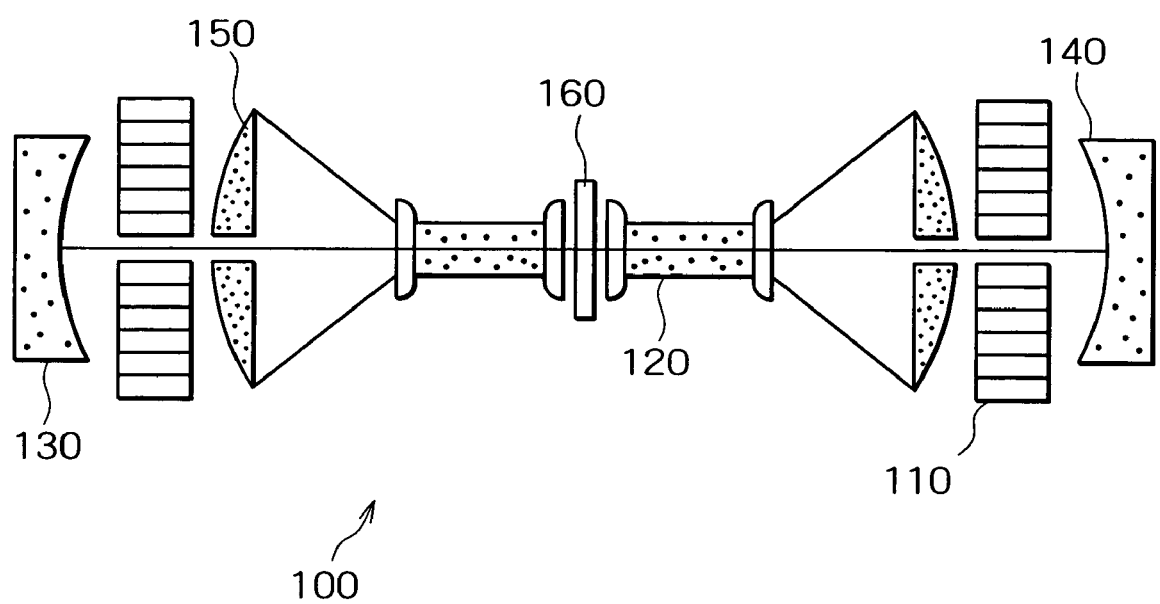
FIG. 1 is a schematic outline diagram showing the structure of a conventional semiconductor-laser excited solid-state laser apparatus.
Figure 2:
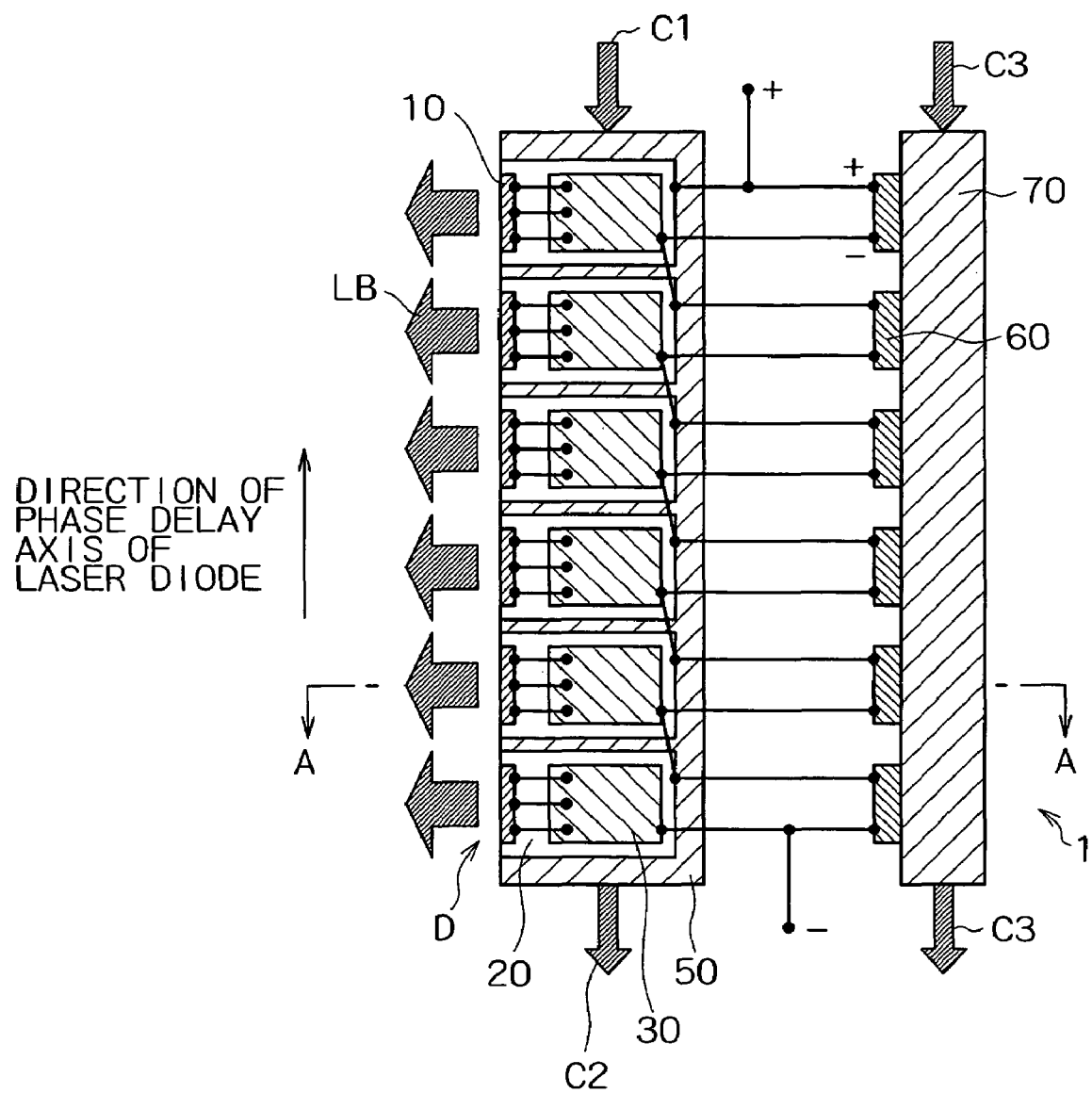
FIG. 2 is a schematic outline diagram illustrating the structure of a semiconductor laser device according to a first embodiment of the present invention.
Figure 3:
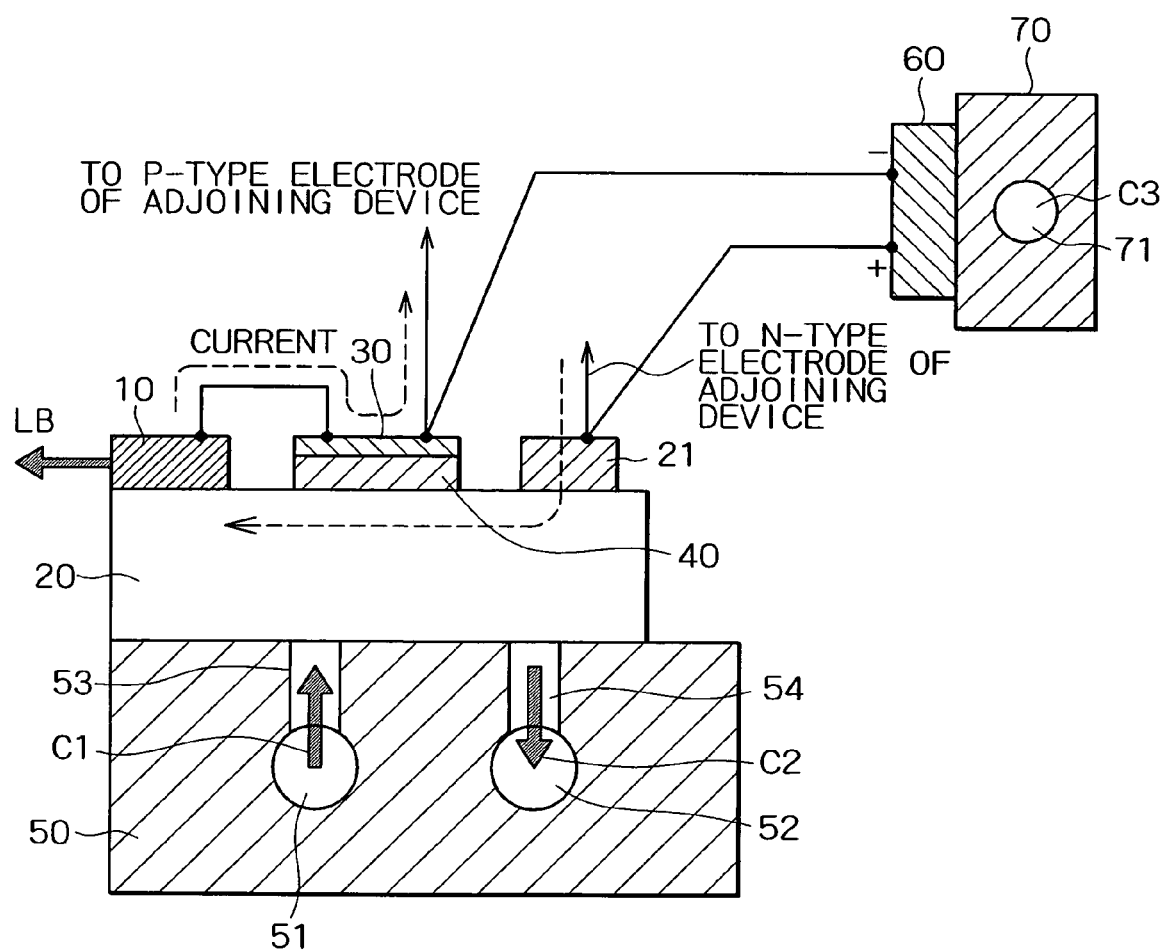
FIG. 3 is a cross-sectional view of the semiconductor laser device along line A—A in FIG. 2.

FIG. 2 is a schematic outline diagram illustrating the structure of the semiconductor laser device according to the embodiment and FIG. 3 is a cross-sectional view of the semiconductor laser device along line A—A in FIG. 2.

A semiconductor laser device is provided with a plurality of light emitting devices D (each hereinafter simply referred to as "device") which emit a plurality of laser beams LB.

Each device D has a laser diode 10, a heat sink 20, an n-type electrode 30 and an insulating member 40, as shown in FIG. 2 or FIG. 3. The semiconductor laser device 1 further has a manifold 50, a bypass diode 60 and a cold plate 70.

The laser diode (semiconductor laser diode (LD)) 10 may use a mixed crystal, such as AlGaAs or InGaAsP on a GaAs substrate, for example, or may be of a type which generates a laser beam of near 808 nm if case of Nd:YAG excitation. of course, the laser diode 10 may use other semiconductor crystals or may be of types which have other wavelengths.

Further, the laser diode 10 in use may have a length of, for example, 1 cm.

Each laser diode 10 is fixed on the associated heat sink 20 and is linearly laid out in the direction of the phase delay axis (or the direction of the phase advance axis).

The following description of the embodiment discusses the case where a plurality of laser diodes 10 are linearly laid out in the direction of the phase delay axis, while the case where a plurality of laser diodes 10 are linearly laid out in the direction of the phase advance axis will be discussed in the descriptions of the seventh and eighth embodiments.

Each laser diode 10 is connected to a p-type electrode member 21 of the heat sink 20 at its anode side (positive electrode, p-type semiconductor side (p side) terminal) and is connected to an n-type electrode 30 at its cathode side (negative electrode, n-type semiconductor side (n side) terminal). The "terminal" includes an electrically connected contact surface in addition to a terminal to which a wire is connected.

As the p-type electrode member 21 of the heat sink 20 of each device D is connected to the n-type electrode 30 of that of that device D which is adjoining to the former device D on one side, the individual laser diodes 10 are connected in series to one another.

Further, a bypass diode 60 provided at the subsequent stage of each laser diode 10 is connected in parallel to the laser diode 10.

The parallel connection of the bypass diode 60 will be discussed in the later description on "Examples of Connection of Bypass Diodes to Laser Diodes".

The heat sinks 20 equal in quality to the laser diodes 10 are provided to absorb heat generated from the laser diodes 10 secured to the heat sinks 20. To permit heat absorption, cooling water (HS-cooling supply water C1) supplied from the manifold 50 flows inside the heat sink 20.

The individual heat sinks 20 are arranged and fixed onto the integrated manifold 50.

The heat sink 20 is generally made of a metal having a high conductance (e.g., copper) and serves itself as a p-type electrode. As an arbitrary portion of the heat sink 20 is threaded, the threaded portion serves as a wiring connection portion.

In the embodiment, the portion that is formed as an electrode on the top surface of the heat sink 20 (including the threaded portion or so for wiring) is the p-type electrode member 21 for the sake of descriptive convenience.

The heat sink 20 as the p-type electrode is electrically connected to the anode side of the associated laser diode 10.

The heat sink 20 (p-type electrode member 21) is also connected to the anode side of the associated bypass diode 60. Further, the heat sink 20 (p-type electrode member 21) is also connected to the n-type electrode 30 of the device D which is located adjacent on one side to the device D that has this heat sink 20 (p-type electrode member 21).

Figure 4:
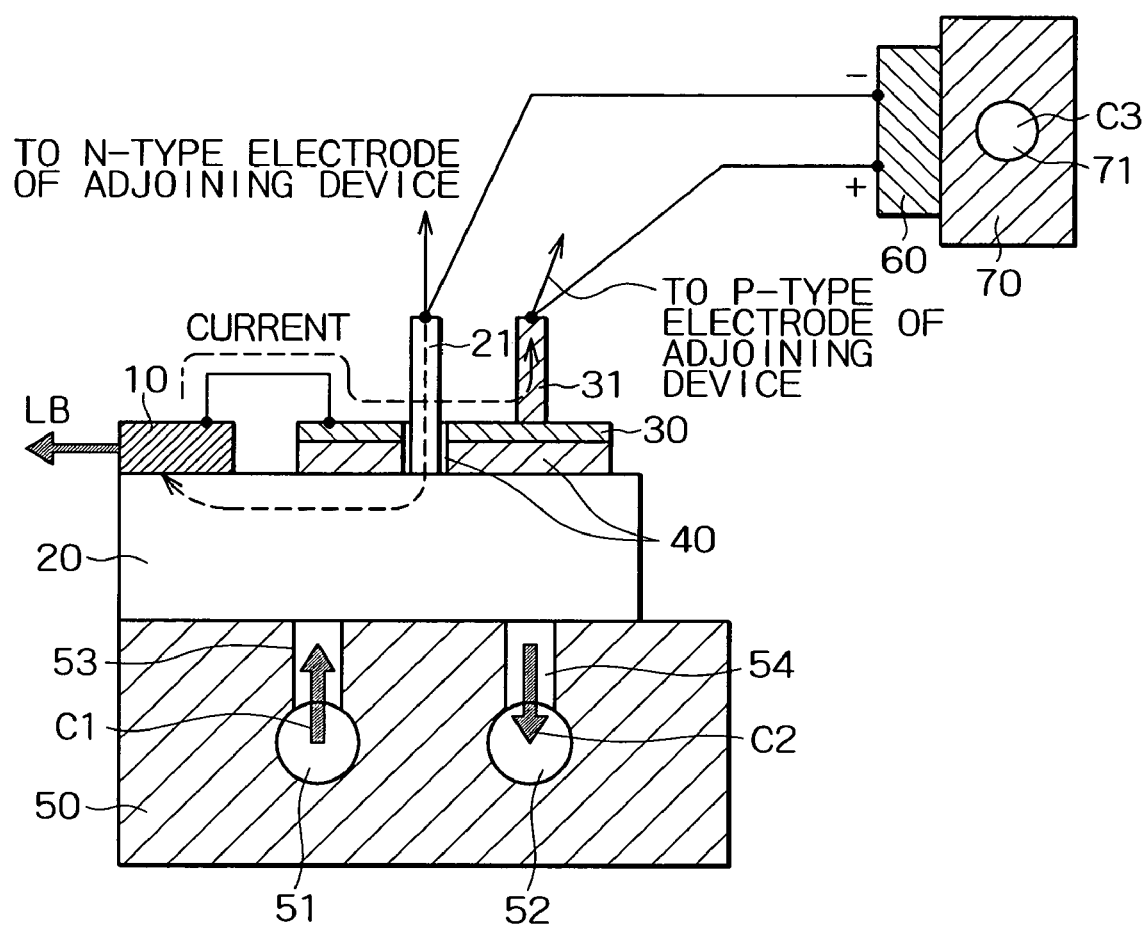
FIG. 4 is a schematic outline diagram showing another structure of the semiconductor laser device according to the first embodiment of the invention.

Although the p-type electrode member 21 is provided at a position apart from the n-type electrode 30 in FIG. 3, the position is not limited to the position apart from the n-type electrode 30 but the p-type electrode member 21 can be provided at a position where it penetrates the n-type electrode 30 as shown in FIG. 4.

It is to be noted however that the insulating member 40 is provided between the p-type electrode member 21 and the n-type electrode 30 to electrically insulate them from each other.

This structure can make the top surface area of the heat sink 20 smaller.

The n-type electrode 30 is fixed to the heat sink 20 via the insulating member 40.

The n-type electrode 30 is connected to the cathode side of the laser diode 10 and is also connected to the cathode side of the bypass diode 60.

The n-type electrode 30 is further connected to the p-type electrode member 21 of that device D which is located adjacent to the device D having this n-type electrode 30.

In case where a device D2 is laid out on one side of a device D1 and a device D3 is laid out on the other side of the device D1, for example, when the n-type electrode 30 of the device D1 is connected to the p-type electrode member 21 of the device D2, the p-type electrode member 21 of the device D1 is connected to the n-type electrode 30 of the device D3.

As shown in FIG. 4, an extension portion 31 can be provided at the n-type electrode 30.

The extension portion 31 is formed in such a shape that the height from the heat sink 20 to the upper end portion (top portion) of the extension portion 31 becomes equal to the height from the heat sink 20 to the upper end portion (top portion) of the p-type electrode member 21.

This can facilitate wiring to the p-type electrode member 21 and wiring to the n-type electrode 30 in the wiring process at the time of fabricating the semiconductor laser device 1.

The insulating member 40 is a member (first insulating member) for electrically insulate the n-type electrode 30 from the heat sink 20.

The insulating member 40 can be formed of, for example, ceramics, an insulative resin or so.

In case where the p-type electrode member 21 is provided so as to penetrate the n-type electrode 30, an insulating member 40 (second insulating member) for electrically insulating the p-type electrode member 21 from the n-type electrode 30 is provided between the p-type electrode member 21 and the n-type electrode 30.

The bypass diode 60 is fixed to the heat sink 20 in such a way that the p side of the bypass diode 60 contacts the heat sink 20. The n-type electrode 30 is provided on the n side of the bypass diode 60. In case where the p-type electrode member 21 is provided in such a way as to penetrate both the bypass diode 60 and the n-type electrode 30, an insulating member 40 (second insulating member) is provided between the p-type electrode member 21 and the bypass diode 60 and between the p-type electrode member 21 and the n-type electrode 30 for electrical insulation therebetween.

The manifold 50 is provided with pipes (cooling water pipes) through which the cooling water to be supplied to the heat sink 20 (HS-cooling supply water C1) and the heat-absorbed discharge water from the heat sink 20 (HS-cooled discharge water C2) flow.

The cooling pipes include a cooling-water supply main pipe 51 through which the HS-cooling supply water C1 flows throughout the manifold 50, a cooling-water discharge main pipe 52 through which the HS-cooled discharge water C2 flows throughout the manifold 50, supply-water branching pipes 53 which are branched from the cooling-water supply main pipe 51 to be connected to the respective heat sinks 20 and supply the HS-cooling supply water C1 to the individual heat sinks 20, and discharge-water leading pipes 54 which feed the HS-cooled discharge water C2 from the heat sinks 20 to the cooling-water discharge main pipe 52.

Although the cooling-water supply main pipe 51, cooling-water discharge main pipe 52, and so forth are provided in the center of the manifold 50 in FIG. 3, etc., their locations are not limited to the center of the manifold 50 but the pipes can be provided at arbitrary positions in the manifold 50.

Although the cross-sectional shapes of the cooling-water supply main pipe 51 and the cooling-water discharge main pipe 52 are formed circular in FIG. 3, etc., they are not limited to the circles but may take arbitrary shapes, such as a rectangle or an ellipsis.

As the manifold 50 with the above-described structure is provided to supply the HS-cooling supply water C1 to the heat sink 20, the heat sink 20 can absorb heat generated from the laser diode 10. This can prevent the device D from being damaged by a rise in temperature.

Although the HS-cooling supply water C1, the HS-cooled discharge water C2 or BD cooling water C3 is used as a refrigerant in the embodiment, the refrigerant is not limited to those cooling waters but air for air cooling, a liquid or fluid other than water (e.g., antifreeze liquid or alcohol) can be used as a refrigerant as well.

The manifold 50 is formed of an insulating material typified by, for example, ceramics or plastic.

While the manifold 50 is provided under the heat sink 20 in FIG. 2, etc., the location is not limited to under the heat sink 20 but the manifold 50 may be provided sideways or above the heat sink 20.

The bypass diode 60 is a diode to be connected in parallel to one laser diode 10 or two or more laser diodes 10 connected in series.

In the parallel connection, the anode side (p-side terminal) of the bypass diode 60 is connected to the anode side of the laser diode 10 to be connected in parallel to the bypass diode 60, and the cathode side (n-side terminal) of the bypass diode 60 is connected to the cathode side of the laser diode 10 to be connected in parallel to the bypass diode 60.

With this structure, when some laser diode in the semiconductor laser device or semiconductor-laser excited solid-state laser apparatus fails or is disconnected, the current can be let flow to the bypass diode 60 instead of the laser diode 10. As a result, the current can flow to the other laser diodes 10 which are not disconnected, thus ensuring continuous light emission. As the forward voltage is applied to the bypass diode 60, it is possible to reduce a variation in the time constant of the circuit when the laser diode is disconnected, thereby suppressing the delay of the rising time, dullness of the waveform or so, as compared with the case where a Zener diode which uses the breakdown characteristic is used as a bypass device.

The parallel connection of the bypass diode 60 will be discussed in the later description on "Examples of Connection of Bypass Diodes to Laser Diodes".

The bypass diode 60 is fixed to the cold plate 70 in which the cooling water (BD cooling water C3) flows.

Accordingly, the heat generated in the bypass diode 60 is absorbed by the cold plate 70. This can prevent the device D from being damaged by a rise in temperature.

The bypass diode 60 is use has a rising voltage higher than the rising voltage of the laser diode 10.

In the semiconductor laser device 1, therefore, normally, the current flows to the laser diodes 10 but hardly flows to the bypass diodes 60. When one of the laser diodes 10 is disconnected due to a failure or so, however, the current starts flowing to the bypass diode 60 connected in parallel to the failing or disconnected laser diode 10. Because the current keeps flowing to the laser diodes other than the failing or disconnected laser diode 10, therefore, the semiconductor laser device 1 can keep generating a laser beam.

Like the laser diode 10, the bypass diode 60 can use a crystal on a GaAs substrate, or a crystal on a substrate of sapphire, SiC or the like.

Figure 6:
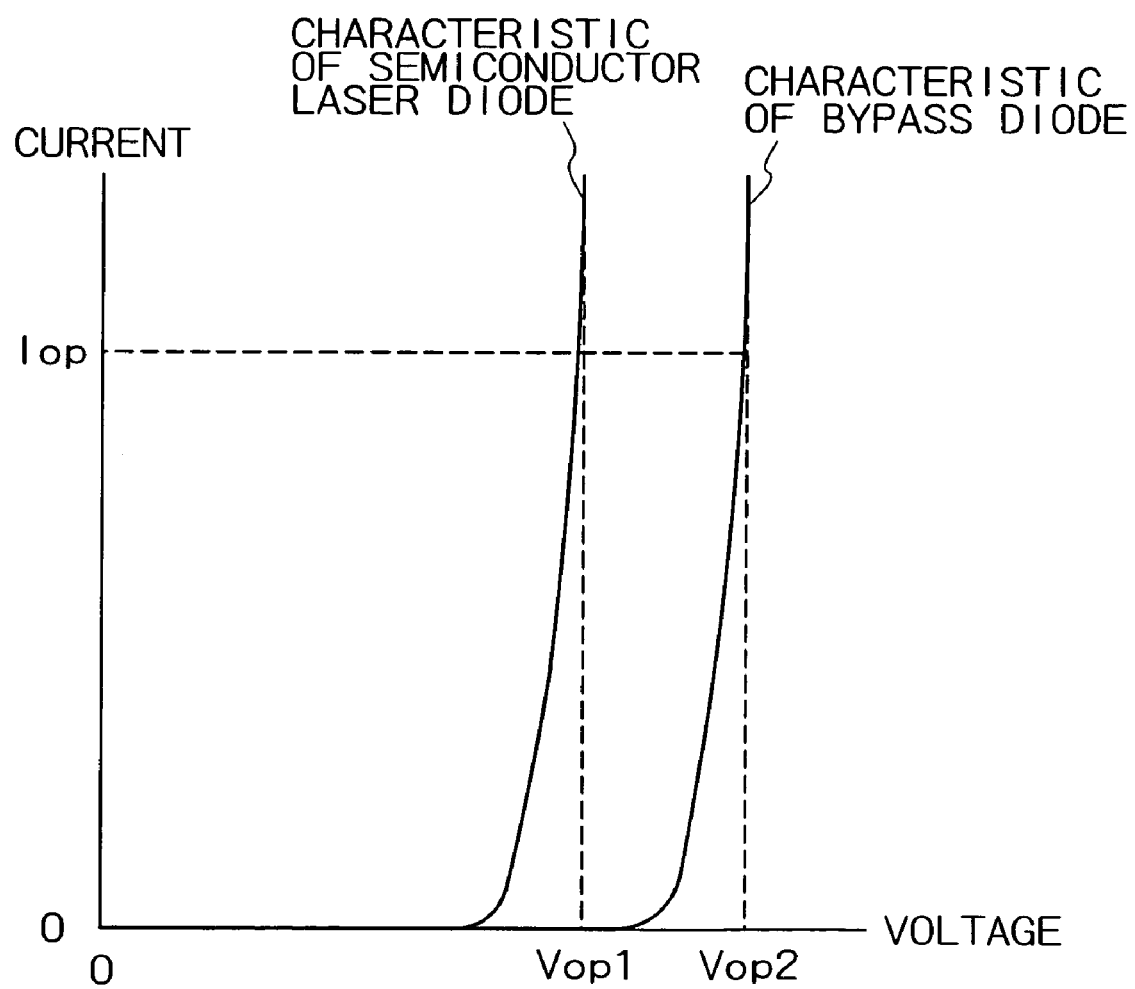
FIG. 6 is a graph showing the voltage-current characteristics of the semiconductor laser diode and bypass diode.

The bypass diode 60 can be of any type of diode as long as the diode shows the current-voltage characteristic as shown in FIG. 6 when the forward voltage is applied to the bypass diode 60.

Figure 5:
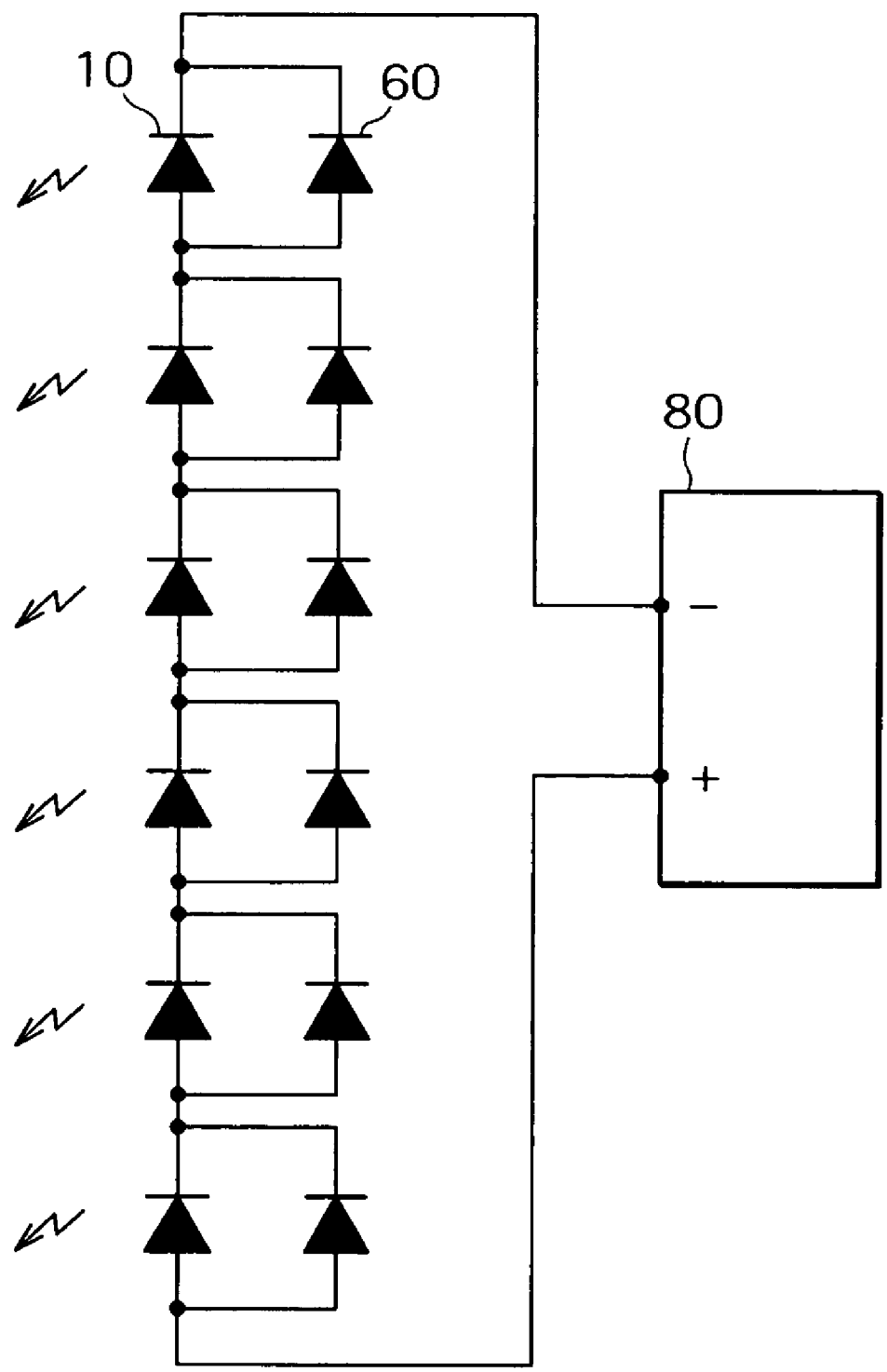
FIG. 5 is an electrical circuit diagram showing an example of connection of semiconductor laser diodes and bypass diodes.
Figure 7:
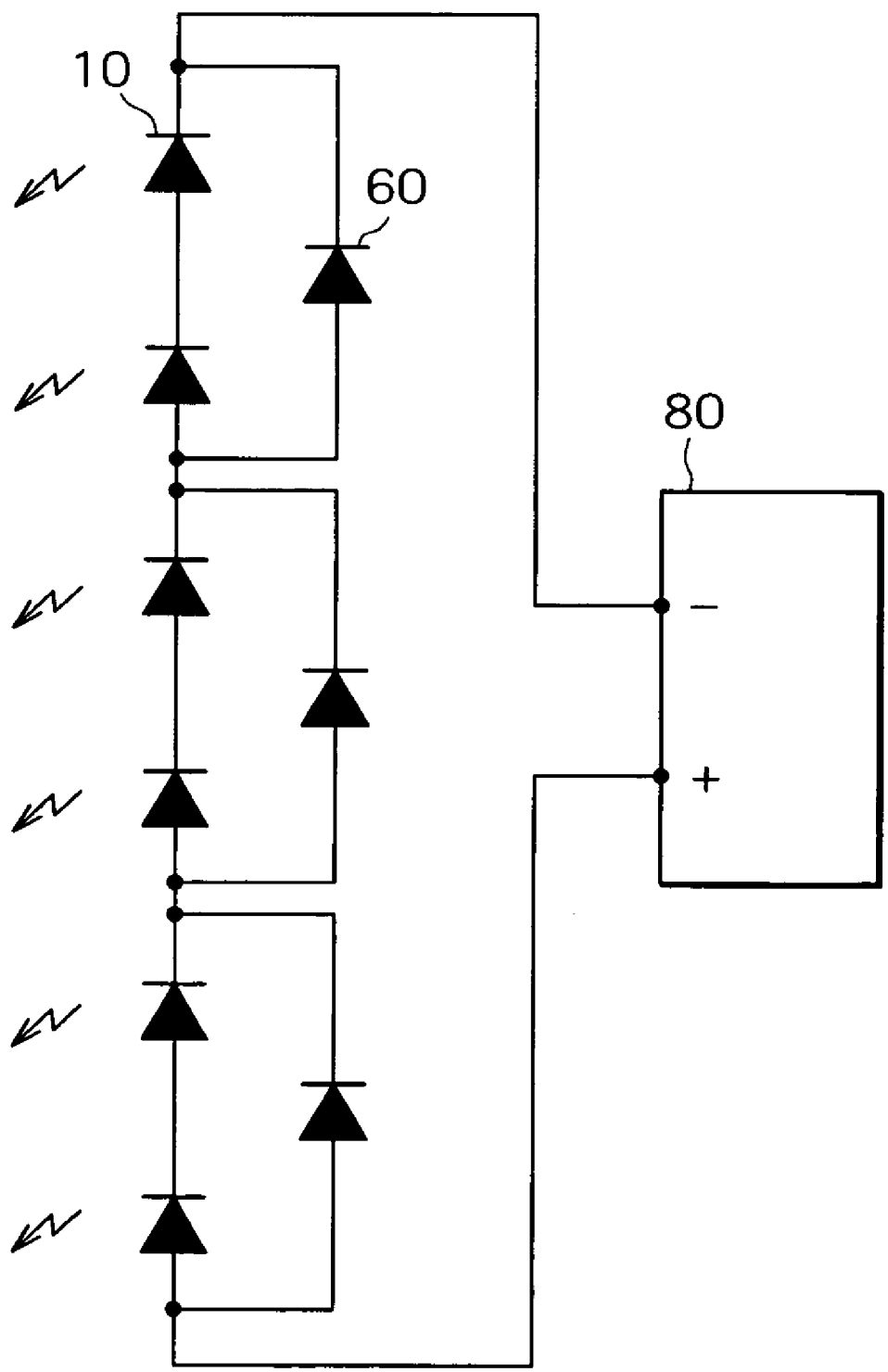
FIG. 7 is an electrical circuit diagram showing another example of connection of semiconductor laser diodes and bypass diodes.
Figure 8:
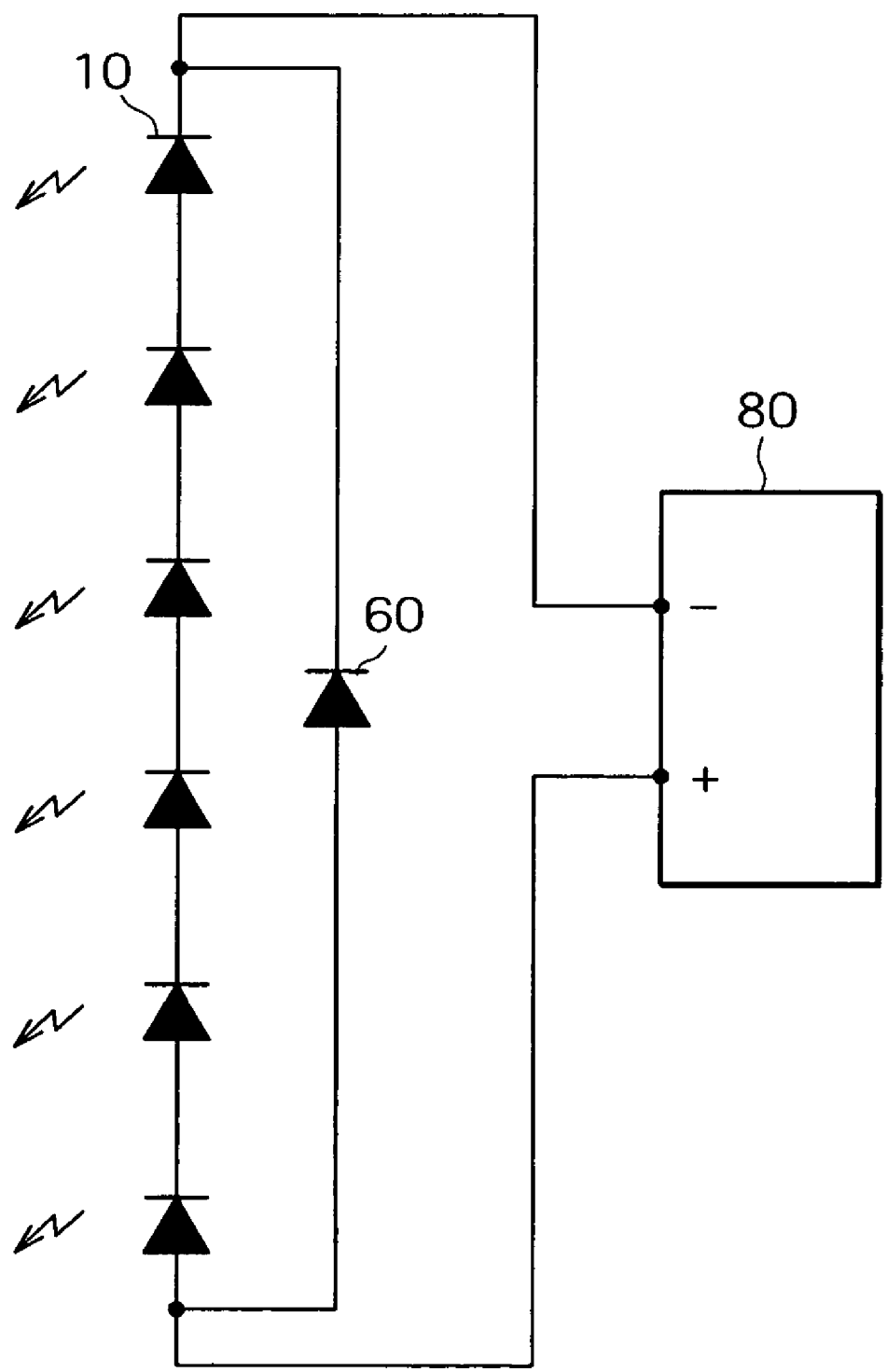
FIG. 8 is an electrical circuit diagram showing a further example of connection of semiconductor laser diodes and bypass diodes.

Although the bypass diodes 60 are connected in parallel to all the laser diodes 10 in FIGS. 5, 7 and 8, the parallel connection may not be made to all the laser diodes and the bypass diode 60 may be connected in parallel to some of all the laser diodes 10.

It is however desirable that the laser diodes 10 to which the bypass diodes 60 are not connected in parallel should be those which are unlikely to be disconnected or which have taken some measures against disconnection.

The cold plate (first cooling member) 70 is provided with a cooling water pipe 71 inside to absorb heat generated in the bypass diode 60 fixed to the cold plate 70. A cooling water as a refrigerant (BD cooling water C3) flows in the cooling water pipe 71.

The cold plate 70 can be formed of a metal having an excellent thermal conductivity, such as copper or stainless steel. In case where the cold plate 70 is formed of a metal having a high thermal conductivity, however, it is necessary to provide an insulating film (not shown) between the cold plate 70 and the bypass diode 60.

In FIG. 2, six devices (each having the laser diode 10, heat sink 20, n-type electrode 30 and insulating member 40) and six bypass diodes 60 are provided. The quantity is not however limited to six, but may be five or less or seven or greater.

(Examples of Connection of Bypass Diodes to Laser Diodes)

Examples of connection of the bypass diodes to the laser diodes are discussed below referring to FIGS. 5 to 8.

FIGS. 5, 7 and 8 are electric circuit diagrams respectively showing examples of connection of the bypass diodes to the laser diodes in the semiconductor laser device, and FIG. 6 is a graph showing the voltage-current characteristics of the laser diode and bypass diode.

The laser diodes 10 and the bypass diodes 60 in the semiconductor laser device 1 can be connected in such a way that as shown in FIG. 5, for example, the bypass diodes 60 are connected in parallel to the respective laser diodes 10 (one bypass diode 60 connected in parallel to one laser diode 10).

In this case, the anode side of each bypass diode 60 is connected to the anode side of the laser diode 10 which is connected in parallel to that bypass diode 60 and the cathode side of each bypass diode 60 is the cathode side of the laser diode 10 which is connected in parallel to that bypass diode 60.

The bypass diode 60 connected in parallel in this manner has such a rising voltage characteristic that its rising voltage is higher than rising voltage of the laser diode 10 as shown in FIG. 6.

As the voltage is applied to both ends of the bypass diode 60 and the laser diode 10 connected in parallel to each other, therefore, the current flows to the laser diode 10 having a low rising voltage while the current hardly flows to the bypass diode 60 having a high rising voltage.

Therefore, the laser diode 10 can execute laser emission as the inherent function in the normal state, but when the laser diode 10 fails or is disconnected thereafter, the current flows to the bypass diode 60 connected in parallel to that laser diode 10 so that the current showing a predetermined value keeps flowing to the other laser diodes 10 without interruption, thus ensuring continuous emission of laser beams.

As each bypass diode 60 having a higher rising voltage than that of the laser diodes 10 is connected in parallel to the associated laser diode 10, therefore, even if one of the plural laser diodes 10 fails or is disconnected, the entire semiconductor laser device does not stop and the other laser diodes 10 can keep emitting laser beams.

Although a single bypass diode 60 is connected in parallel to its associated single laser diode 10 in FIG. 5, the connection is not limited to this one-to-one. For example, a single bypass diode 60 may be connected in parallel to two or more series-connected laser diodes 10.

Specifically, as shown in FIG. 7, a plurality of laser diodes 10 may be separated into plural groups each including two series-connected laser diodes 10, and a single bypass diode 60 may be connected in parallel to each group.

Even with the circuit structure, even if one laser diode 10 fails or is disconnected, the current showing a predetermined value keeps flowing to the laser diodes 10 which belong to other groups than the group that has the failing or disconnected laser diode 10, so that the semiconductor laser device can maintain laser emission.

Although two laser diodes 10 belong to a single group in the circuit diagram of the semiconductor laser device shown in FIG. 7, the quantity is not limited to two, but may differ from one group to another.

As another example of connection, all the laser diodes 10 provided in the semiconductor laser device may be taken as a single group to which a single bypass diode 60 is connected in parallel, as shown in FIG. 8.

In this case, however, if one laser diode 10 fails or is disconnected, the current does not flow to the other laser diodes so that the semiconductor laser device does not perform laser emission thereafter.

(Second Embodiment)

The structure of a semiconductor laser device according to the second embodiment of the invention is discussed below referring to FIG. 9.

Figure 9:
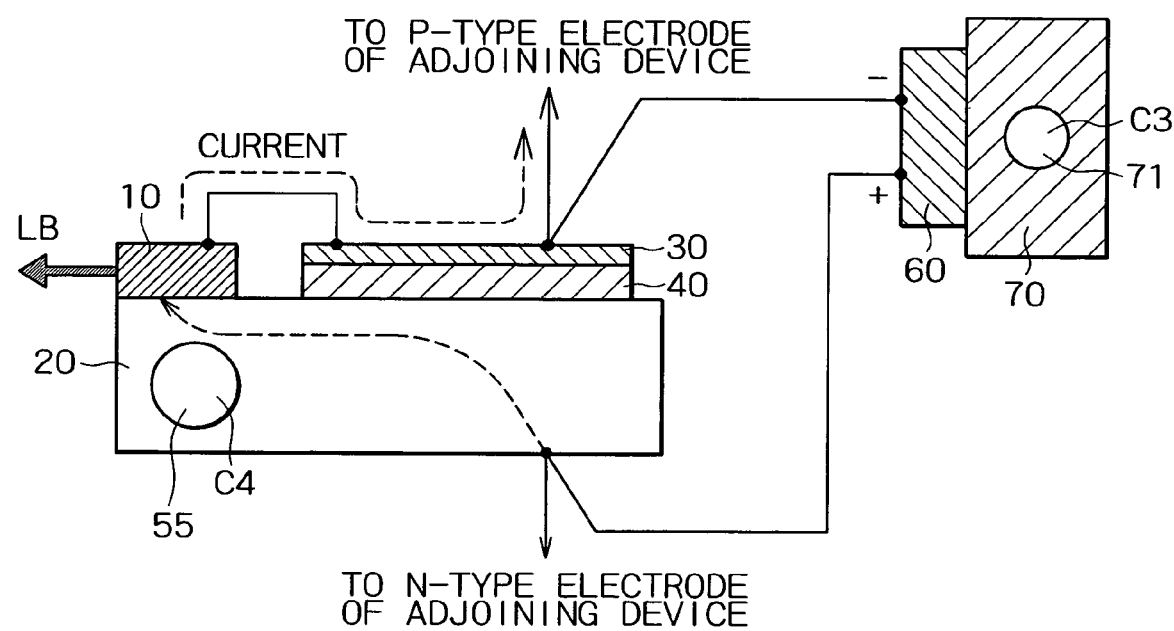
FIG. 9 is a schematic cross-sectional view illustrating the structure of a semiconductor laser device according to a second embodiment of the invention.

FIG. 9 is a schematic cross-sectional view illustrating the structure of the semiconductor laser device according to the second embodiment.

This embodiment differs from the first embodiment in the structures of the heat sink, the manifold and the cooling water pipe. The first embodiment has the cooling water pipe provided on the manifold, whereas the second embodiment has a cooling water pipe provided in the heat sink so that the manifold can be omitted. The other structural elements are the same as those of the first embodiment.

To avoid the redundant description, therefore, like or same reference numerals are given to those components in FIG. 9 which are the same as the corresponding components in FIG. 3.

As shown in FIG. 9, the semiconductor laser device 1 has a plurality of devices which emit a plurality of laser beams LB and each of which has the laser diode 10, the heat sink 20, the n-type electrode 30 and the insulating member 40. The semiconductor laser device 1 further has the bypass diodes 60 and the cold plate 70.

The heat sinks 20 equal in quality to the laser diodes 10 are provided to absorb heat generated from the laser diodes 10 fixed to the heat sinks 20. To ensure heat absorption, a cooling water pipe 55 for allowing the cooling supply water C1 to flow is provided inside the heat sink 20.

The cooling water pipe 55 is formed inside the heat sink 20 in parallel to the direction of the phase delay axis of the laser diode 10 and allows a cooling water C4 to flow.

The provision of the heat sink 20 having the structure can allow the heat generated from the laser diode 10 to be absorbed by the cooling water C4. This can prevent the device from being damaged by a rise in temperature.

As the manifold can be eliminated, the semiconductor laser device can be made more compact.

In FIG. 9, the p-type electrode is omitted and the heat sink 20 serves as the p-type electrode.

Accordingly, the heat sink 20 is electrically connected to the anode side of the laser diode 10. The heat sink 20 is also connected to the anode side of the bypass diode 60. The heat sink 20 is further current the n-type electrode 30 of that device which is located adjacent to the device having this heat sink 20.

This design can make the top surface area of the heat sink 20 smaller.

(Third Embodiment)

The structure of a semiconductor laser device according to the third embodiment of the invention is discussed below referring to FIG. 10.

Figure 10:
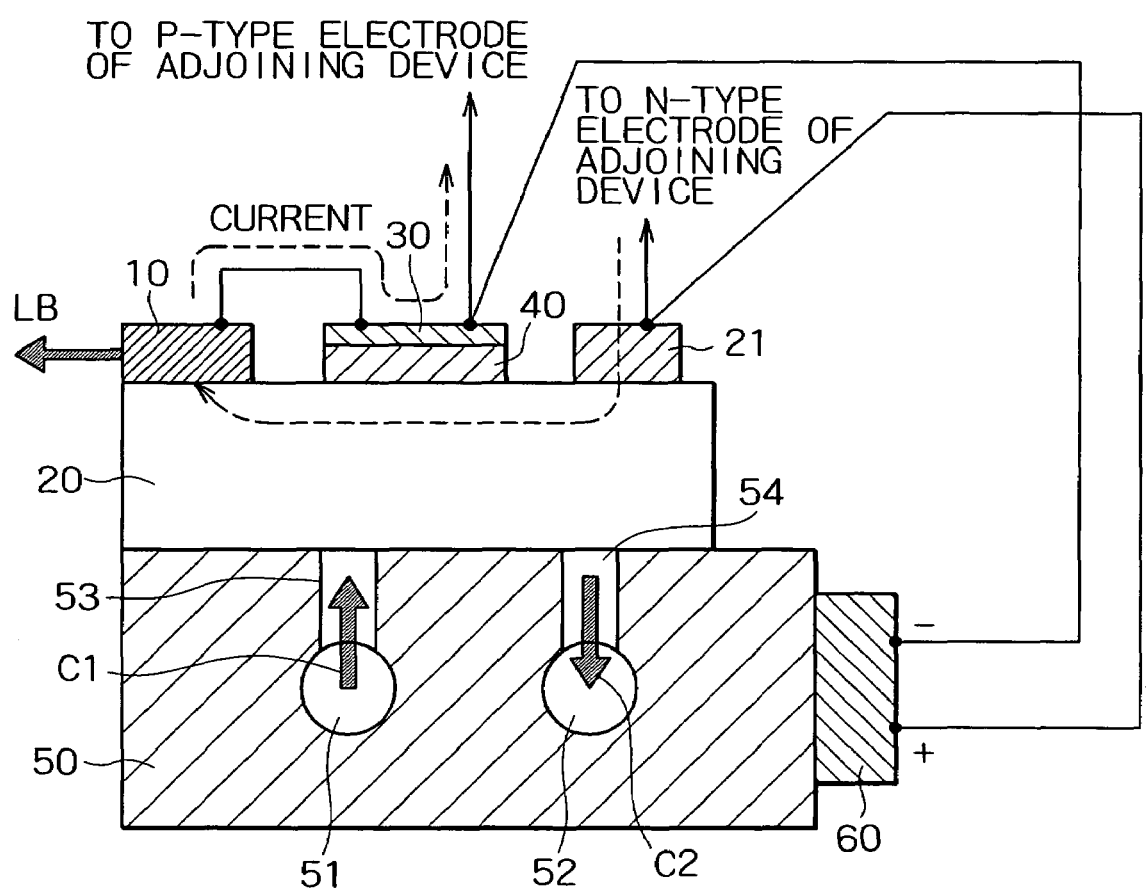
FIG. 10 is a schematic cross-sectional view illustrating the structure of a semiconductor laser device according to a third embodiment of the invention.

FIG. 10 is a schematic cross-sectional view illustrating the structure of the semiconductor laser device according to the third embodiment.

This embodiment differs from the first embodiment in the layout position of the bypass diode. The first embodiment has the bypass diode provided at a position apart from the device, whereas the third embodiment has the bypass diode secured to the manifold. The other structural elements are the same as those of the first embodiment.

To avoid the redundant description, therefore, like or same reference numerals are given to those components in FIG. 10 which are the same as the corresponding components in FIG. 3.

As shown in FIG. 10, the semiconductor laser device 1 has a plurality of devices which emit a plurality of laser beams LB and each of which has the laser diode 10, the heat sink 20, the n-type electrode 30 and the insulating member 40. The semiconductor laser device 1 further has the manifold 50 and the bypass diodes 60.

The bypass diode 60 is secured to the manifold 50.

The structure can allow the manifold 50 to absorb the heat generated from the bypass diode 60. This structure can also prevent a heat-originated damage on the device.

As the manifold 50 absorbs the heat generated in the bypass diode 60, the cold plate 70 shown in FIG. 3 becomes unnecessary. This can ensure further size reduction of the semiconductor laser device 1. Further, the cooling water C3 flowing inside the cold plate 70 likewise becomes unnecessary, leading to cost reduction.

(Fourth Embodiment)

The structure of a semiconductor laser device according to the fourth embodiment of the invention is discussed below referring to FIG. 11.

Figure 11:
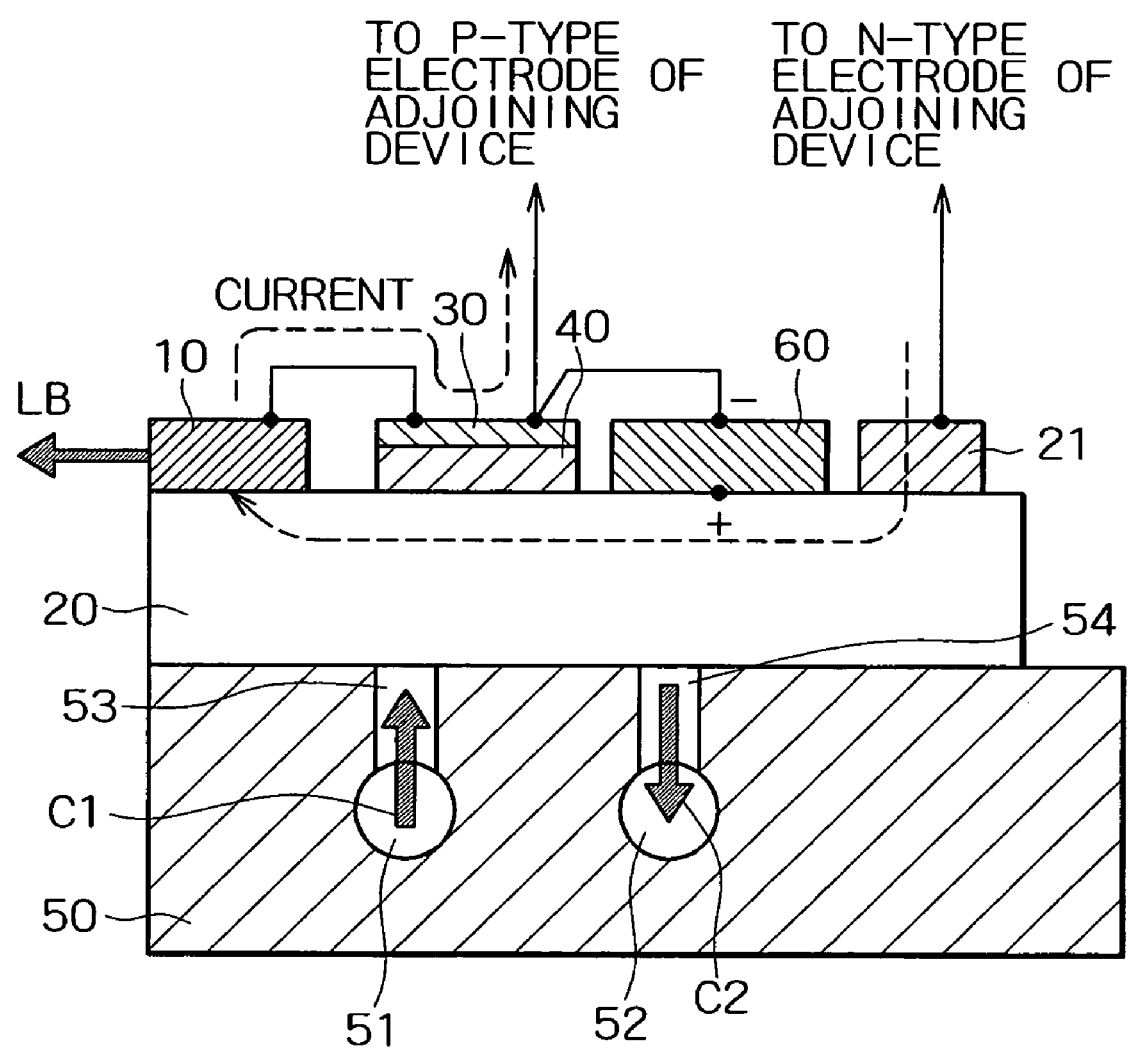
FIG. 11 is a schematic cross-sectional view illustrating the structure of a semiconductor laser device according to a fourth embodiment of the invention.

FIG. 11 is a schematic cross-sectional view illustrating the structure of the semiconductor laser device according to the fourth embodiment.

This embodiment differs from the first embodiment in the layout position of the bypass diode. The first embodiment has the bypass diode provided at a position apart from the device, whereas the fourth embodiment has the bypass diode secured to the heat sink. The other structural elements are the same as those of the first embodiment.

To avoid the redundant description, therefore, like or same reference numerals are given to those components in FIG. 11 which are the same as the corresponding components in FIG. 3.

As shown in FIG. 11, the semiconductor laser device 1 has a plurality of devices which emit a plurality of laser beams LB and each of which has the laser diode 10, the heat sink 20, the n-type electrode 30 and the insulating member 40. The semiconductor laser device 1 further has the manifold 50 and the bypass diodes 60.

The bypass diode 60 is secured to the heat sink 20.

The structure can allow the heat sink 20 to absorb the heat generated from the bypass diode 60. This structure can also prevent a heat-originated damage on the device.

As the heat sink 20 absorbs the heat generated in the bypass diode 60, the cold plate 70 shown in FIG. 3 becomes unnecessary. This can ensure further size reduction of the semiconductor laser device 1. Further, the cooling water C3 flowing inside the cold plate 70 likewise becomes unnecessary, leading to cost reduction.

In addition, the wiring to connect the n-type electrode 30 to the bypass diode 60 can be made shorter and the wiring to connect the heat sink 20 to the bypass diode 60 can be eliminated, thus ensuring further cost reduction.

(Fifth Embodiment)

The structure of a semiconductor laser device according to the fifth embodiment of the invention is discussed below referring to FIG. 12.

Figure 12:
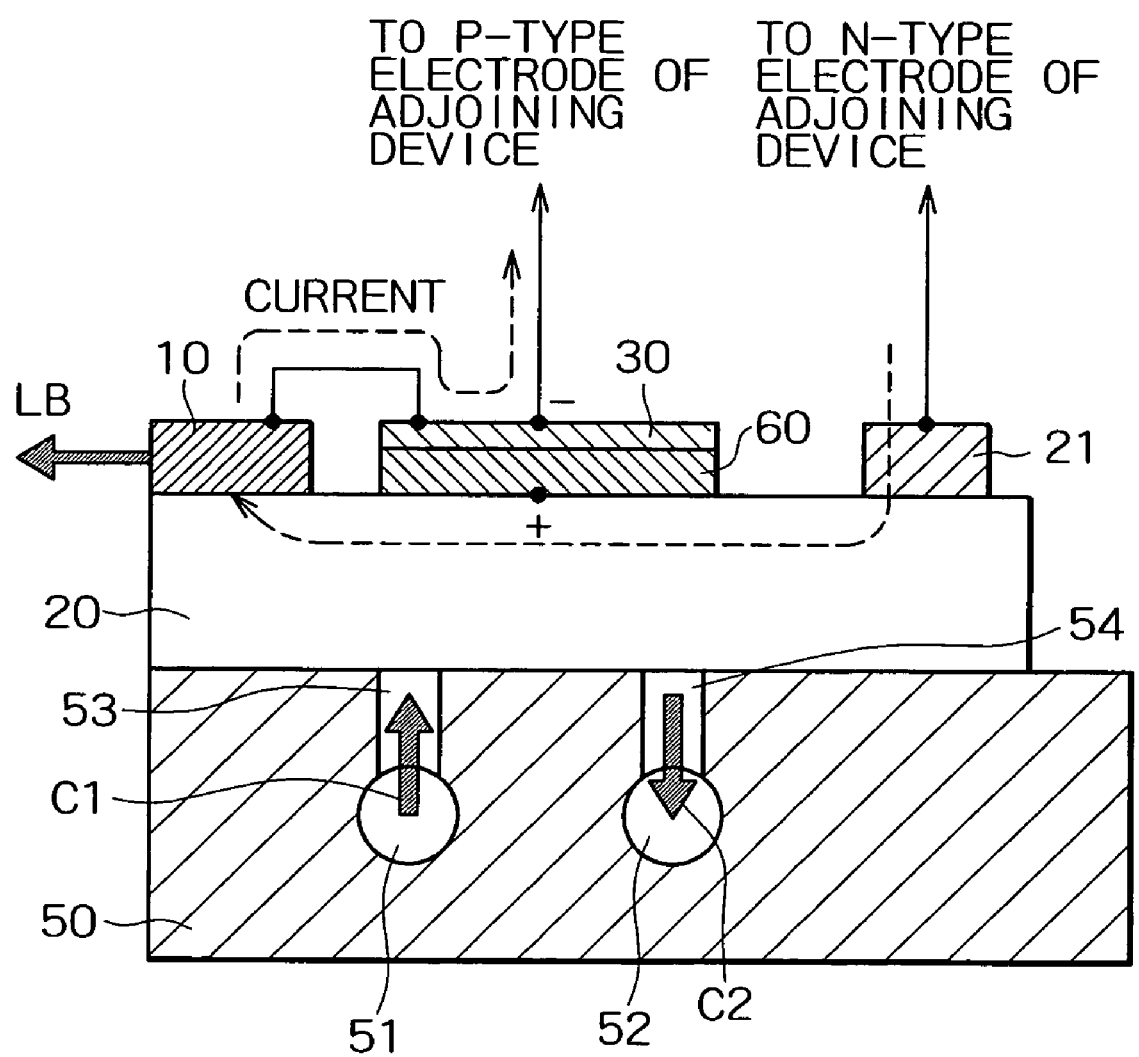
FIG. 12 is a schematic cross-sectional view illustrating the structure of a semiconductor laser device according to a fifth embodiment of the invention.

FIG. 12 is a schematic cross-sectional view illustrating the structure of the semiconductor laser device according to the fifth embodiment.

This embodiment differs from the first embodiment in the layout position of the bypass diode. The first embodiment has the bypass diode provided at a position apart from the device, whereas the fifth embodiment has the bypass diode provided in place of the insulating member. The other structural elements are the same as those of the first embodiment.

To avoid the redundant description, therefore, like or same reference numerals are given to those components in FIG. 12 which are the same as the corresponding components in FIG. 3.

As shown in FIG. 12, the semiconductor laser device 1 has a plurality of devices which emit a plurality of laser beams LB and each of which has the laser diode 10, the heat sink 20 and the n-type electrode 30. The semiconductor laser device 1 further has the manifold 50 and the bypass diodes 60.

The bypass diode 60 is provided between the n-type electrode 30 and the heat sink 20 in such a way as to isolate the n-type electrode 30 from the heat sink 20. That is, the bypass diode 60 is provided in place of the insulating member 40 shown in FIG. 3.

This structure can maintain electrical isolation between the n-type electrode 30 and the heat sink 20.

The bypass diode 60 is directly connected and secured to the heat sink 20 at its anode side (p side). The n-type electrode 30 is formed on the cathode side (n side) of the bypass diode 60.

This structure can allow the heat sink 20 to absorb the heat generated from the bypass diode 60. This structure can also prevent a heat-originated damage on the device.

As the heat sink 20 absorbs the heat generated in the bypass diode 60, the cold plate 70 shown in FIG. 3 becomes unnecessary. This can ensure further size reduction of the semiconductor laser device 1. Further, the cooling water C3 flowing inside the cold plate 70 likewise becomes unnecessary, leading to cost reduction.

In addition, the wiring to connect the n-type electrode 30 to the bypass diode 60 and the wiring to connect the heat sink 20 to the bypass diode 60 can be eliminated, thus ensuring further cost reduction.

As the insulating member can be omitted, the cost can be reduced further.

(Sixth Embodiment)

The structure of a semiconductor laser device according to the sixth embodiment of the invention is discussed below referring to FIG. 13.

Figure 13:
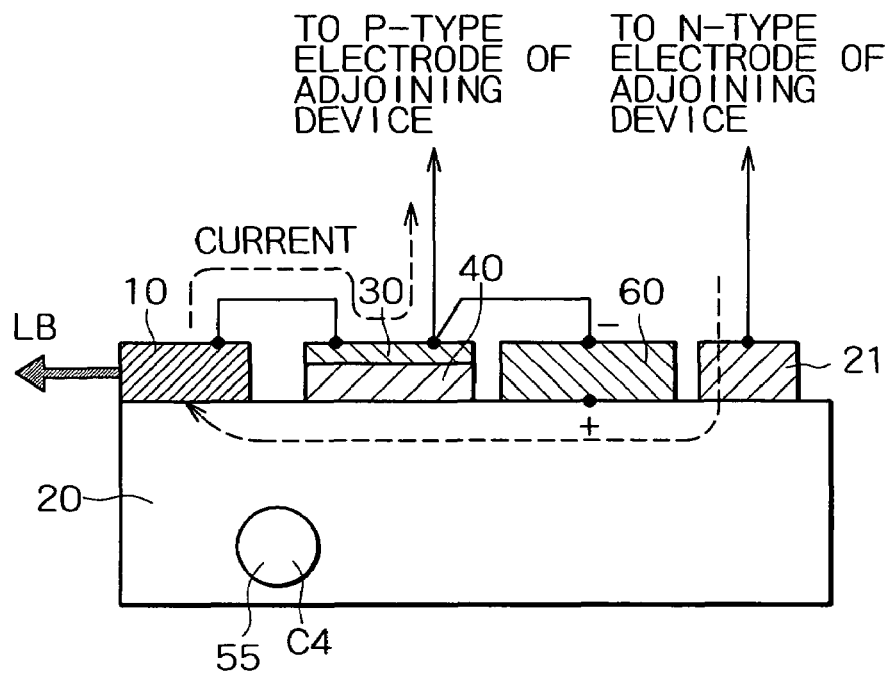
FIG. 13 is a schematic cross-sectional view illustrating the structure of a semiconductor laser device according to a sixth embodiment of the invention.

FIG. 13 is a schematic cross-sectional view illustrating the structure of the semiconductor laser device according to the sixth embodiment.

This embodiment differs from the first embodiment in the layout position of the bypass diode and the presence or absence of the manifold. The first embodiment has the bypass diode provided at a position apart from the device and has the manifold, whereas the sixth embodiment has the bypass diode provided in place of the insulating member and eliminates the manifold. The other structural elements are the same as those of the first embodiment.

To avoid the redundant description, therefore, like or same reference numerals are given to those components in FIG. 13 which are the same as the corresponding components in FIG. 3.

As shown in FIG. 13, the semiconductor laser device 1 has a plurality of devices which emit a plurality of laser beams LB and each of which has the laser diode 10, the heat sink 20, the n-type electrode 30 and the insulating member 40. The semiconductor laser device 1 further has the bypass diodes 60.

The heat sinks 20 equal in quality to the laser diodes 10 are provided to absorb heat generated from the laser diodes 10 fixed to the heat sinks 20. To ensure heat absorption, a cooling water pipe 55 for allowing the cooling supply water C1 to flow is provided inside the heat sink 20.

The cooling water pipe 55 is formed inside the heat sink 20 in parallel to the direction of the phase delay axis of the laser diode 10 and allows a cooling water C4 to flow.

The provision of the heat sink 20 having the structure can allow the heat generated from the laser diode 10 to be absorbed by the cooling water C4. This can prevent the device from being damaged by a rise in temperature.

As the manifold can be eliminated, the semiconductor laser device can be made more compact.

In FIG. 13, the p-type electrode is omitted and the heat sink 20 serves as the p-type electrode.

Accordingly, the heat sink 20 is electrically connected to the anode side of the laser diode 10. The heat sink 20 is also connected to the anode side of the bypass diode 60. The heat sink 20 is further current the n-type electrode 30 of that device which is located adjacent to the device having this heat sink 20. This can make the heat sink 20 smaller.

The bypass diode 60 is secured to one side of the heat sink 20 (which may be the top surface or side surface). The structure can allow the heat sink 20 to absorb the heat generated from the bypass diode 60.

The anode side (p side) of the bypass diode 60 is electrically connected to the heat sink 20.

As the heat sink 20 absorbs the heat generated in the bypass diode 60, the cold plate 70 shown in FIG. 3 becomes unnecessary. This can ensure further size reduction of the semiconductor laser device 1.

Further, the cooling water C3 flowing inside the cold plate 70 likewise becomes unnecessary, leading to cost reduction.

Figure 14:
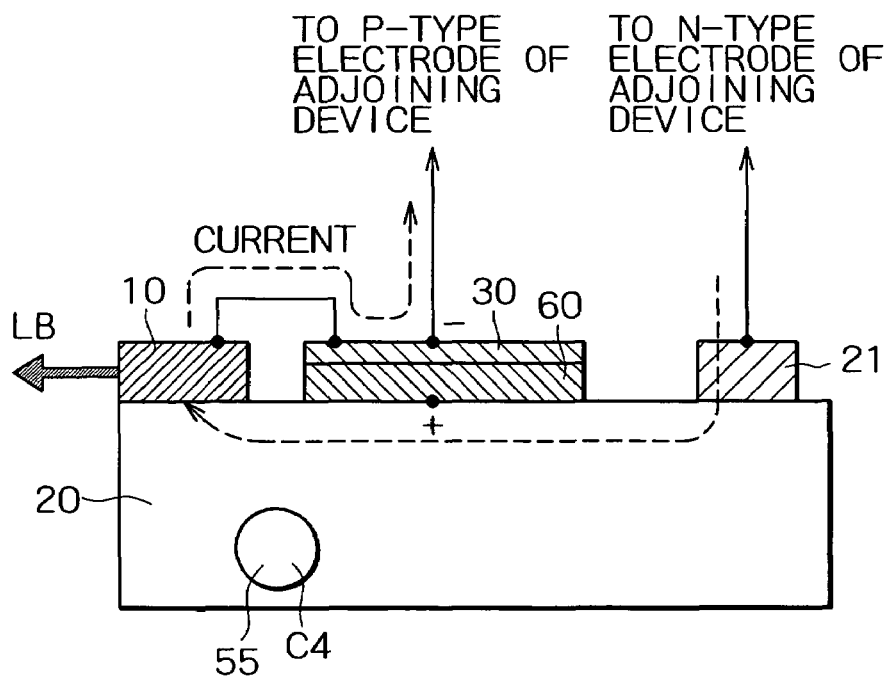
FIG. 14 is a schematic cross-sectional view illustrating another structure of the semiconductor laser device according to the sixth embodiment of the invention.

The bypass diode 60 can be provided between the n-type electrode 30 and the heat sink 20 in such a way as to isolate the n-type electrode 30 from the heat sink 20, as shown in FIG. 14. That is, the bypass diode 60 is provided in place of the insulating member 40 shown in FIG. 13.

This structure can maintain electrical isolation between the n-type electrode 30 and the heat sink 20.

Further, the wiring to connect the n-type electrode 30 to the bypass diode 60 and the wiring to connect the heat sink 20 to the bypass diode 60 can be eliminated, thus ensuring further cost reduction.

In addition, as the insulating member can be omitted, the cost can be reduced further.

(Seventh Embodiment)

The structure of a semiconductor laser device according to the seventh embodiment of the invention is discussed below referring to FIGS. 15 and 16.

Figure 15:
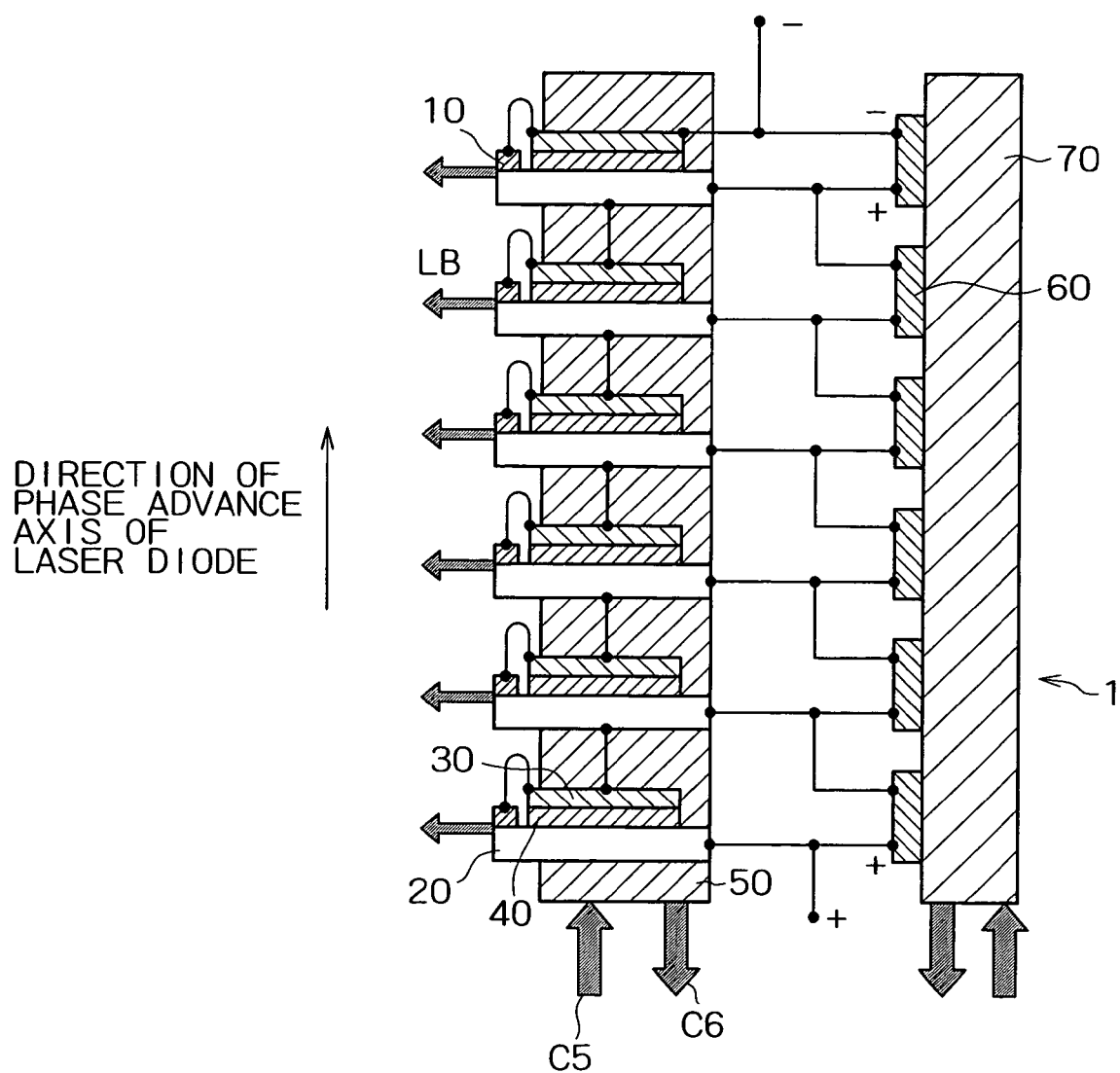
FIG. 15 is a schematic outline diagram illustrating the structure of a semiconductor laser device according to a seventh embodiment of the invention.
Figure 16:
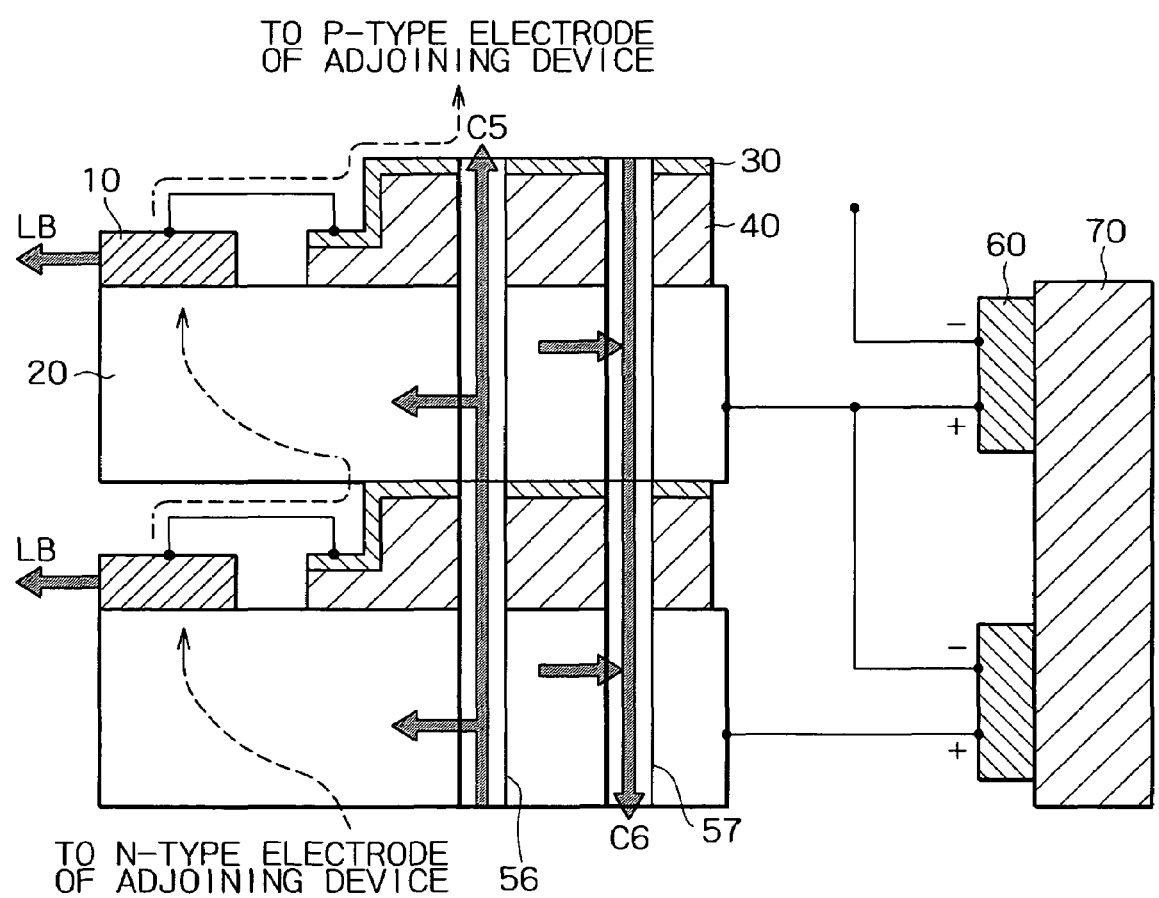
FIG. 16 is a cross-sectional view showing the cross sections of two semiconductor laser diodes in the semiconductor laser device in FIG. 15.

FIG. 15 is a schematic outline diagram illustrating the structure of a semiconductor laser device which has a plurality of laser diodes linearly laid out in the direction of the phase advance axis, and FIG. 16 is a cross-sectional view showing the cross sections of two semiconductor laser diodes in the semiconductor laser device in FIG. 15.

This embodiment differs from the first embodiment in the direction of the layout of the semiconductor laser diodes. The first embodiment has the semiconductor laser diodes laid out in the direction of the phase delay axis, whereas the seventh embodiment has the semiconductor laser diodes laid out in the direction of the phase advance axis. The other structural elements are the same as those of the first embodiment.

To avoid the redundant description, therefore, like or same reference numerals are given to those components in FIGS. 15 and 16 which are the same as the corresponding components in FIGS. 2 and 3.

As shown in FIG. 15 or 16, the semiconductor laser device 1 has a plurality of devices each of which has the laser diode 10, the heat sink 20, the n-type electrode 30 and the insulating member 40. The semiconductor laser device 1 further has the manifold 50, the bypass diodes 60 and the cold plate 70.

The individual laser diodes 10 are secured onto the associated heat sinks 20 and are linearly laid out in the direction of the phase advance axis.

Each laser diode 10 is connected to the heat sink 20 at its anode side (p side) and is connected to the n-type electrode 30 at its cathode side (n side).

As each heat sink 20 is connected to the n-type electrode 30 of that device which is located adjacent in a given direction of each device having this heat sink 20, the individual laser diodes 10 are connected in series to one another.

Further, the bypass diode 60 provided at the subsequent stage of the associated laser diode 10 is connected in parallel to the laser diode 10.

The heat sinks 20 equal in quality to the laser diodes 10 are provided to absorb heat generated from the laser diodes 10 fixed to the heat sinks 20.

To ensure heat absorption, a cooling-water supply main pipe 56 for allowing a cooling supply water C5 to flow and a cooling-water discharge main pipe 57 for allowing a cooling discharge water C6 to flow are provided inside the heat sink 20.

The cooling-water supply main pipe 56 and cooling-water discharge main pipe 57 are provide in such a way as to penetrate the n-type electrode 30 d the insulating member 40 as well as the heat sink 20.

Having this structure, the heat sink 20 can absorb the heat generated from the laser diode 10. This can prevent the device from being damaged by a rise in temperature.

Although the HS-cooling supply water C1, the HS-cooled discharge water C2 or the BD cooling water C3 are used as a refrigerant in the embodiment, the refrigerant is not limited to those waters. For instance, air for air cooling, a liquid or fluid can be used as a refrigerant as well.

The n-type electrode 30 is secured to the heat sink 20 via the insulating member 40.

The n-type electrode 30 is connected to the cathode side of the laser diode 10 and is also connected to the cathode side of the bypass diode 60.

The n-type electrode 30 is further connected to the heat sink 20 (p-type electrode member 21) of that device which is located adjacent to the device having this n-type electrode 30.

In case where the device D2 is laid out on one side of the device D1 and the device D3 is laid out on the other side of the device D1, for example, when the n-type electrode 30 of the device D1 is connected to the heat sink 20 (p-type electrode member 21) of the device D2, the heat sink 20 (p-type electrode member 21) of the device D1 is connected to the n-type electrode 30 of the device D3.

Although the n-type electrode 30 is located at a position apart from the heat sink 20 of the adjoining device in FIG. 15, it may be laid out in direct contact with the heat sink 20 of the adjoining device as shown in FIG. 16. This structure allows the n-type electrode 30 to be electrically connected to the heat sink 20 which serves as the p-type electrode member 21 without using any wiring.

The insulating member 40 is a member to electrically insulate the n-type electrode 30 from the heat sink 20.

The manifold 50 is secured to the individual heat sinks 20.

The bypass diode 60 is a diode which is connected in parallel to its associated single laser diode 10 or two or more series-connected laser diodes 10.

In case where this parallel connection is employed, the anode side (p side) of the bypass diode 60 is connected to the anode side of the laser diode 10 connected in parallel to the bypass diode 60, while the cathode side (n side) of the bypass diode 60 is connected to the cathode side of the laser diode 10 connected in parallel to the bypass diode 60.

The bypass diode 60 is secured to the cold plate 70 in which the cooling water (BD cooling water C3) flows.

Accordingly, the cold plate 70 absorbs heat generated in the bypass diode 60. It is therefore possible to prevent the device from being damaged by a rise in temperature.

The bypass diode 60 in use has a higher rising voltage than that of the laser diode 10.

In the semiconductor laser device 1, therefore, normally, the current flows to the laser diodes 10 but hardly flows to the bypass diodes 60. When one of the laser diodes 10 is disconnected due to a failure or so, however, the current starts flowing to the bypass diode 60 connected in parallel to the failing or disconnected laser diode 10. Because the current keeps flowing to the other laser diodes than the failing or disconnected laser diode 10, therefore, the semiconductor laser device 1 can keep generating a laser beam.

The cold plate (first cooling member) 70 has the cooling water pipe 71 provided inside to absorb heat generated in the bypass diode 60 fixed to the cold plate 70. The cooling water (BD cooling water C3) as a refrigerant flows in the cooling water pipe 71.

In FIG. 15, six devices (each having the laser diode 10, heat sink 20, n-type electrode 30 and insulating member 40) and six bypass diodes 60 are provided. The quantity is not however limited to six, but may be five or less or seven or greater.

(Eighth Embodiment)

The structure of a semiconductor laser device according to the eighth embodiment of the invention is discussed below referring to FIG. 17.

Figure 17:
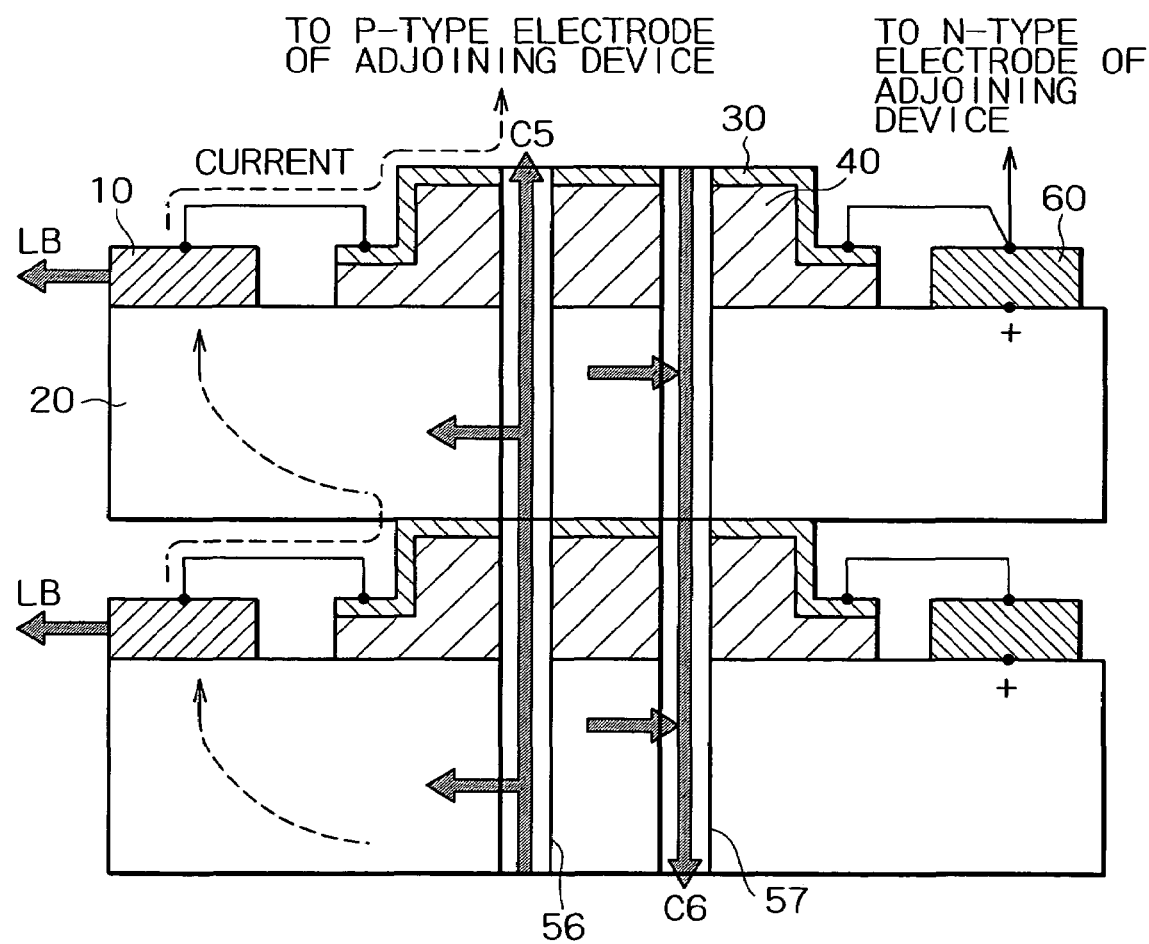
FIG. 17 is a schematic cross-sectional view illustrating the structure of a semiconductor laser device according to an eighth embodiment of the invention.

FIG. 17 is a schematic cross-sectional view illustrating the cross sections of two of plural laser diodes 10 laid out in the direction of the phase advance axis.

This embodiment differs from the first embodiment in the layout direction of the laser diodes and the layout position of the bypass diode. The first embodiment has the laser diodes laid out in the direction of the phase delay axis and the bypass diode provided at a position apart from the device, whereas the eighth embodiment has the laser diodes laid out in the direction of the phase advance axis and has the bypass diode provided on the heat sink. The other structural elements are the same as those of the first embodiment.

To avoid the redundant description, therefore, like or same reference numerals are given to those components in FIG. 17 which are the same as the corresponding components in FIG. 3.

As shown in FIG. 17, the semiconductor laser device 1 has a plurality of devices which emit a plurality of laser beams LB and each of which has the laser diode 10, the heat sink 20, the n-type electrode 30 and the insulating member 40. The semiconductor laser device 1 further has the bypass diodes 60.

The bypass diode 60 is formed on and secured to the heat sink 20. Accordingly, the anode side (p side) of the bypass diode 60 is directly connected to the heat sink 20. (which may be the top surface or side Further, the cathode side (n side) of the bypass diode 60 is connected to the n-type electrode 30.

As the bypass diode 60 is secured onto the heat sink 20 in this manner, the heat sink 20 can absorb heat generated from the bypass diode 60. It is therefore possible to prevent the bypass diode 60 from being damaged by the generated heat.

The provision of the bypass diode 60 onto the heat sink 20 can eliminate the cold plate 70 shown in FIG. 15. This can ensure further size reduction of the semiconductor laser device 1 and cost reduction.

Figure 18:
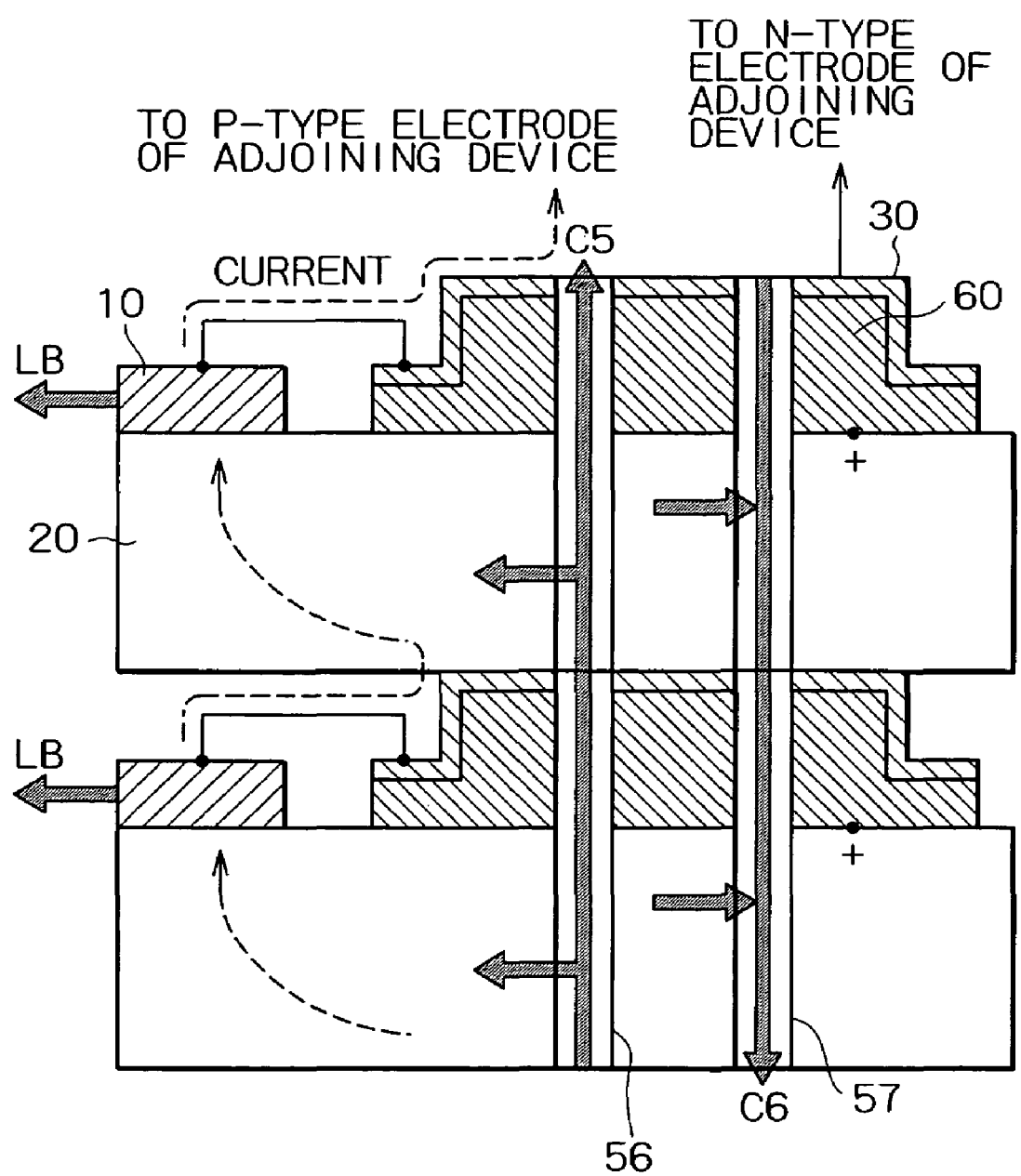
FIG. 18 is a schematic cross-sectional view illustrating another structure of the semiconductor laser device according to the eighth embodiment of the invention.

The bypass diode 60 can be provided between the n-type electrode 30 and the heat sink 20 in such a way as to isolate the n-type electrode 30 from the heat sink 20, as shown in FIG. 18. That is, the bypass diode 60 is provided in place of the insulating member 40 shown in FIG. 16.

This structure can maintain electrical isolation between the n-type electrode 30 and the heat sink 20.

Further, the wiring to connect the n-type electrode 30 to the bypass diode 60 and the wiring to connect the heat sink 20 to the bypass diode 60 can be eliminated, thus ensuring further cost reduction.

In addition, as the insulating member can be omitted, the cost can be reduced further.

The semiconductor laser device of each of the embodiments discussed above can be used as an LD array of a semiconductor-laser excited solid-state laser apparatus (LD-excited solid-state laser apparatus).

Therefore, the semiconductor-laser excited solid-state laser apparatus can also accomplish continuous light emission, when at least one semiconductor laser diode fails or is disconnected, by the method which does not use the breakdown characteristic of a Zener diode which is not effective under low-voltage application and with a simple circuit structure which can be made compact.

The semiconductor laser device or the semiconductor-laser excited solid-state laser apparatus according to the invention may be an arbitrary combination of the semiconductor laser devices and semiconductor-laser excited solid-state laser apparatuses according to the first to eighth embodiments.

Although the preferable embodiments of the semiconductor laser device and the semiconductor-laser excited solid-state laser apparatus according to the invention have been described above, the semiconductor laser device and semiconductor-laser excited solid-state laser apparatus according to the invention are not limited to those of the above-described embodiments, but can be modified in various ways within the spirit and scope of the invention.

While the first embodiment is directed to a semiconductor laser device which has the n-type electrode and insulating member provided on the top surface of the heat sink, for example, the location of the n-type electrode and insulating member is not limited to the top surface of the heat sink but they can be provided at an arbitrary position of the heat sink, such as the side surface or bottom surface thereof.

In short, according to the invention, the polarity of one end of each of the semiconductors laser diode is the same as the polarity of that end of the associated bypass diode which is connected to the one end of that semiconductor laser diode and the polarity of the other end of the semiconductor laser diode is the same as the polarity of that end of the associated bypass diode which is connected to the other end of that semiconductor laser diode, so that the semiconductor laser device or semiconductor-laser excited solid-state laser apparatus can accomplish continuous light emission when at least one semiconductor laser diode fails or is disconnected, by using the current-voltage characteristic provided when the forward voltage is applied to the bypass diode.

As the bypass diode to be connected in parallel to the associated semiconductor laser diode has a higher rising voltage than that of the semiconductor laser diode, continuous light emission can be accomplished even if at lest one semiconductor laser diode fails or is disconnected. It is therefore possible to provide the semiconductor laser device and semiconductor-laser excited solid-state laser apparatus which are highly reliable.

Further, as the bypass diode does not use the breakdown characteristic of a Zener diode but uses the current-voltage characteristic when a forward voltage is applied to an ordinary diode, it is possible to make considerably small a variation in the time constant of the circuit in case where some of plural semiconductor laser diodes in the semiconductor laser device are disconnected and the current starts flowing to the bypass diodes connected in parallel to the disconnected semiconductor laser diodes.

Even if some semiconductor laser diodes are disconnected, therefore, the delay of the rising time, a dull waveform, etc. can be restrained and the recovery time after disconnection and a variation in the output intensity of the laser beam can eventually be improved.

In addition, it is only the bypass diode provided as a circuit for accomplishing continuous light emission even if at least one semiconductor laser diode fails or is disconnected. It is therefore possible to ensure continuous light emission from the semiconductor laser device and semiconductor-laser excited solid-state laser apparatus even when at least one semiconductor laser diode fails or is disconnected.

What is claimed is:

1. A semiconductor laser device comprising:
   a plurality of semiconductor laser diodes connected in series to one another;
   a plurality of bypass diodes each connected in parallel to at least one semiconductor laser diode, wherein each bypass diode has a higher rising voltage than a rising voltage of said at least one semiconductor laser diode to which it is connected in parallel; and
   a plurality of heat sinks, each having a refrigerant inside, wherein one of said plurality of heat sinks is fixed to each of said plurality of semiconductor laser diodes;
   wherein a first end of each bypass diode has a polarity equal to a polarity of a first end of said at least one semiconductor laser diode to which it is connected, and a second end of each bypass diode has a polarity equal to a polarity of a second end of said at least one semiconductor laser diode to which it is connected.

2. The semiconductor laser device according to claim 1, further comprising a manifold which supplies said refrigerant to each of said heat sinks.

3. The semiconductor laser device according to claim 2, wherein said bypass diodes are fixed to said manifold.

4. A semiconductor-laser excited solid-state laser apparatus having a semiconductor laser device as recited in claim 2.

5. The semiconductor laser device according to claim 1, wherein each of said bypass diode is connected in parallel to one semiconductor diode and is fixed to that of said heat sinks which is fixed to the associated semiconductor laser diode connected in parallel to that bypass diode.

6. The semiconductor laser device according to claim 5,
further comprising an n-type electrode provided on an n side of each of said bypass diodes and a p-type electrode provided on a p side of each of said bypass diodes;
wherein each of said bypass diodes is fixed to the associated heat sink such that a p side of said bypass diode contacts said heat sink, and
said n-type electrode is connected to a p-type electrode of another bypass diode.

7. A semiconductor-laser excited solid-state laser apparatus having a semiconductor laser device as recited in claim 6.

8. A semiconductor-laser excited solid-state laser apparatus having a semiconductor laser device as recited in claim 5.

9. The semiconductor laser device according to claim 1, further comprising:
a first insulating member connected to each of said heat sinks;
an n-type electrode connected to each first insulating member,
a p-type electrode member connected to each first insulating member such that said p-type electrode member penetrates said first insulating member and said n-type electrode, and
a second insulating member provided between said p-type electrode member and said n-type electrode.

10. The semiconductor laser device according to claim 9, wherein
said bypass diode is provided in place of said first insulating member, and
said second insulating member is provided between said p-type electrode member and said n-type electrode and between said p-type electrode member and said bypass diode.

11. A semiconductor-laser excited solid-state laser apparatus having a semiconductor laser device as recited in claim 10.

12. The semiconductor laser device according to claim 9, further comprising an extension member is disposed on said n-type electrode is-such that a top of said extension member is at a same height as a top of said p-type electrode member.

13. A semiconductor-laser excited solid-state laser apparatus having a semiconductor laser device as recited in claim 9.

14. A semiconductor-laser excited solid-state laser apparatus having a semiconductor laser device as recited in claim 1.

15. A semiconductor laser device comprising:
a plurality of semiconductor laser diodes connected in series to one another;
a plurality of bypass diodes each connected in parallel to at least one semiconductor laser diode, wherein each bypass diode has a higher rising voltage than a rising voltage of said at least one semiconductor laser diode to which it is connected in parallel; and
a first cooling member which is connected to said bypass diodes to cool said bypass diodes;
wherein a first end of each bypass diode has a polarity equal to a polarity of a first end of said at least one semiconductor laser diode to which it is connected, and a second end of each bypass diode has a polarity equal to a polarity of a second end of said at least one semiconductor laser diode to which it is connected; and
wherein said first cooling member comprises a cold plate having a refrigerant inside.

16. A semiconductor-laser excited solid-state laser apparatus having a semiconductor laser device as recited in claim 15.

* * * * *

UNITED STATES PATENT AND TRADEMARK OFFICE
CERTIFICATE OF CORRECTION

PATENT NO. : 7,130,323 B2 Page 1 of 1
APPLICATION NO. : 10/779645
DATED : October 31, 2006
INVENTOR(S) : Masaki Tsunekane It is certified that error appears in the above-identified patent and that said Letters Patent is hereby corrected as shown below:

Column 22, line 9, delete "is".

Column 22, line 9, delete "is-".

Signed and Sealed this

Thirteenth Day of February, 2007

JON W. DUDAS
*Director of the United States Patent and Trademark Office*